United States Patent
Hatsuda

(10) Patent No.: US 11,501,811 B2
(45) Date of Patent: Nov. 15, 2022

(54) SEMICONDUCTOR STORAGE DEVICE AND CONTROLLING METHOD THEREOF

(71) Applicant: Kioxia Corporation, Tokyo (JP)

(72) Inventor: Kosuke Hatsuda, Bunkyo Tokyo (JP)

(73) Assignee: KIOXIA CORPORATION, Tokyo (JP)

(*) Notice: Subject to any disclaimer, the term of this patent is extended or adjusted under 35 U.S.C. 154(b) by 0 days.

(21) Appl. No.: 17/350,382

(22) Filed: Jun. 17, 2021

(65) Prior Publication Data

US 2022/0093148 A1 Mar. 24, 2022

(30) Foreign Application Priority Data

Sep. 18, 2020 (JP) .............................. JP2020-157775

(51) Int. Cl.
*G11C 11/16* (2006.01)
*G11C 7/10* (2006.01)

(52) U.S. Cl.
CPC .......... *G11C 11/1673* (2013.01); *G11C 7/106* (2013.01); *G11C 11/1659* (2013.01); *G11C 11/1675* (2013.01); *G11C 11/1697* (2013.01)

(58) Field of Classification Search
None
See application file for complete search history.

(56) References Cited

U.S. PATENT DOCUMENTS

| 8,923,041 | B2 | 12/2014 | Aandre et al. |
| 10,157,655 | B2 | 12/2018 | Fujino et al. |
| 10,460,784 | B2 | 10/2019 | Ikegami et al. |
| 10,573,388 | B2 | 2/2020 | Gupta et al. |
| 2018/0277186 | A1* | 9/2018 | Hatsu ................. G11C 13/0026 |
| 2019/0221243 | A1 | 7/2019 | Manning et al. |
| 2019/0295621 | A1 | 9/2019 | Ikegami et al. |
| 2019/0295622 | A1* | 9/2019 | Katayama ........... G11C 11/1673 |
| 2019/0311770 | A1 | 10/2019 | Gupta et al. |

FOREIGN PATENT DOCUMENTS

| JP | 2018163728 A | 10/2018 |
| JP | 2019164872 A | 9/2019 |

* cited by examiner

*Primary Examiner* — James G Norman
(74) *Attorney, Agent, or Firm* — Holtz, Holtz & Volek PC

(57) ABSTRACT

In a memory, a first node holds first data from a first cell. A second node holds second data from a second cell near the first cell. A differential circuit includes a first current path passing a first current corresponding to a voltage of the first node and a second current path passing a second current corresponding to a voltage of the second node, and outputs an output signal corresponding to a voltage difference between the first and the second nodes from an output part. A first register latches the output signal and output the signal as a hold signal. A first offset part is connected to the first current path and offsets the first current when the hold signal has a first logic level. A second offset part is connected to the second current path and offsets the second current when the hold signal has a second logic level.

20 Claims, 14 Drawing Sheets

SEMICONDUCTOR STORAGE DEVICE AND CONTROLLING METHOD THEREOF

CROSS REFERENCE TO RELATED APPLICATIONS

This application is based upon and claims the benefit of priority from the prior Japanese Patent Application No. 2020-157775, filed on Sep. 18, 2020, the entire contents of which are incorporated herein by reference.

FIELD

The embodiments of the present invention relate to a semiconductor storage device and controlling method thereof.

BACKGROUND

There is a case where an MRAM (Magnetoresistive Random Access Memory) has a stacked memory cell array in which memory cells are provided to correspond to intersections between bit lines and word lines, respectively. In the stacked memory cell array, the wiring resistances or characteristics of memory cells vary according to the locations of the memory cells. Accordingly, there is a risk that the logic level of data is incorrectly detected if pieces of data are read with a same reference voltage. In order to solve this problem, adjustment of the reference voltage depending on the locations of the memory cells and use of a self-reference method have been proposed.

DETAILED DESCRIPTION

Figure 1:
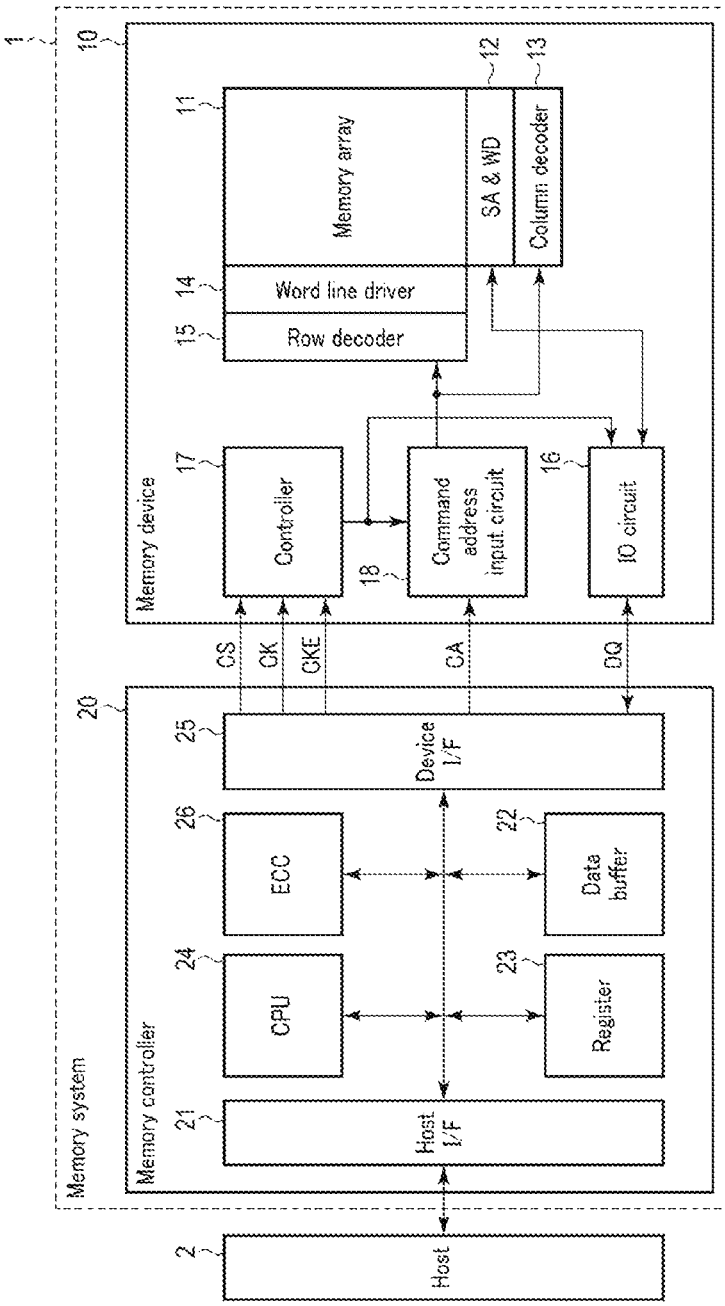
FIG. 1 is a block diagram illustrating a configuration example of a semiconductor storage device according to a first embodiment.

Embodiments will now be explained with reference to the accompanying drawings. The present invention is not limited to the embodiments. In the present specification and the drawings, elements identical to those described in the foregoing drawings are denoted by like reference characters and detailed explanations thereof are omitted as appropriate.

A semiconductor storage device according the present embodiment comprises a plurality of memory cells. A first node holds first data read from a first memory cell among the memory cells. A second node holds second data read from a second memory cell near the first memory cell among the memory cells. A differential circuit comprises a first current path passing a first current corresponding to a voltage of the first node and a second current path passing a second current corresponding to a voltage of the second node, and is configured to output an output signal corresponding to a voltage difference between the first node and the second node from an output part. A first register is configured to latch the output signal and output the signal as a hold signal. A first offset part is connected to the first current path and is configured to offset the first current when the hold signal has a first logic level. A second offset part is connected to the second current path and is configured to offset the second current when the hold signal has a second logic level that is opposite to the first logic level.

First Embodiment

Figure 2:
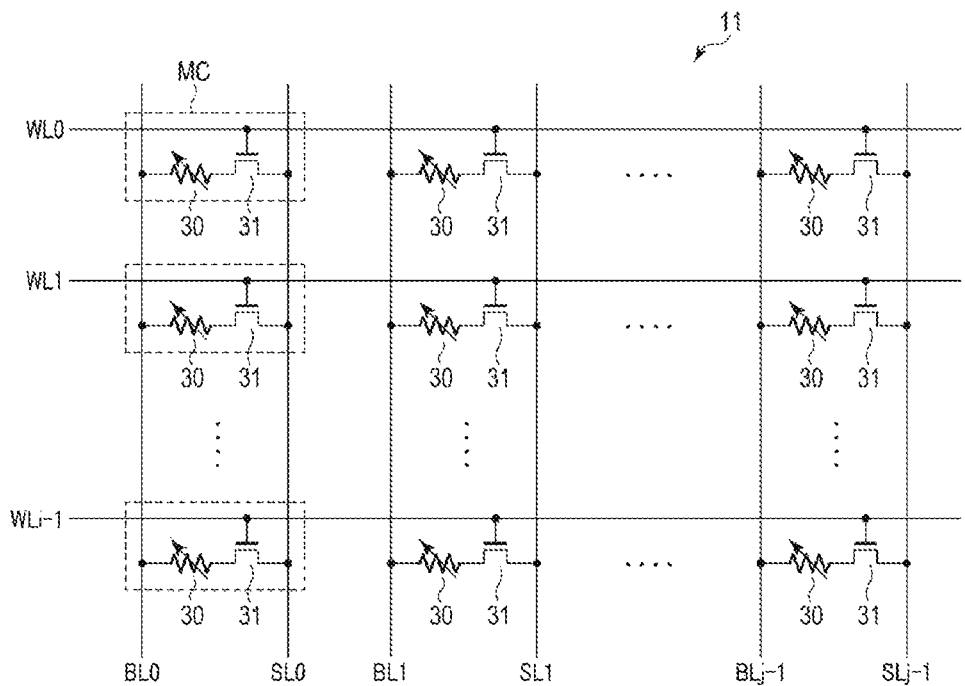
FIG. 2 is a circuit diagram illustrating a configuration example of a memory cell array.

FIG. 1 is a block diagram illustrating a configuration example of a semiconductor storage device according to a first embodiment. FIG. 2 is a circuit diagram illustrating a configuration example of a memory cell array. The semiconductor storage device can be a memory such as an MRAM or a ReRAM (Resistive Random Access Memory) although not particularly limited to any device. The following embodiments are explained assuming that a memory system 1 as the semiconductor storage device is an MRAM.

The memory system 1 being the semiconductor storage device includes a memory device 10 and a memory controller 20.

The memory controller 20 reads data from the memory device 10 or writes data into the memory device 10 in response to an instruction from a host (an external device) 2 such as a personal computer. The memory controller 20 includes a host interface 21, a data buffer 22, a register 23, a CPU (Central Processing Unit) 24, a device interface 25, and an ECC (Error Correcting Code) circuit 26.

The host interface 21 is connected to the host 2. Data transmission, reception, and the like are performed between the host 2 and the memory system 1 via the host interface 21.

The data buffer 22 is connected to the host interface 21. The data buffer 22 receives data transmitted from the host 2 to the memory system 1 via the host interface 21 and temporarily stores the data therein. The data buffer 22 also temporarily stores therein data to be transmitted from the memory system 1 to the host 2 via the host interface 21. The data buffer 22 can be either a volatile memory or a nonvolatile memory.

The register 23 is, for example, a volatile memory and stores therein setting information, a command, a status, or the like to be executed by the CPU 24. The register 23 can be either a volatile memory or a nonvolatile memory.

The CPU 24 controls the entire operation of the memory system 1. For example, the CPU 24 performs predetermined processing to the memory device 10 in accordance with a command received from the host 2.

The device interface 25 performs transmission and reception of various signals and the like between the memory controller 20 and the memory device 10.

The ECC circuit 26 receives write data received from the host 2 via the data buffer 22. The ECC circuit 26 adds an error correcting code to the write data. The ECC circuit 26 supplies the write data having the error correcting code added thereto, for example, to the data buffer 22 or the device interface 25.

The ECC circuit 26 also receives data supplied from the memory device 10 via the device interface 25. The data is data stored in memory cells in a memory cell array 11. The ECC circuit 26 determines whether an error is included in the data received from the memory device 10. When determining that the received data includes an error, the ECC circuit 26 performs error correction processing to the received data using the error correcting code. The ECC circuit 26 then supplies the data subjected to the error correction processing, for example, to the data buffer 22 or the device interface 25.

The memory device 10 includes the memory cell array 11, a sense amplifier/write driver 12, a column decoder 13, a word line driver 14, a row decoder 15, an IO circuit 16, a controller 17, and a command address input circuit 18.

Various external control signals such as a chip select signal CS, a clock signal CK, a clock enable signal CKE, and a command address signal CA are input to the command address input circuit 18 from the memory controller 20. The command address input circuit 18 transfers the command address signal CA to the controller 17.

The controller 17 identifies a command and an address. The controller 17 controls the memory device 10.

The memory cell array 11 is, for example, an MRAM as illustrated in FIG. 2 and a plurality of memory cells MC are arranged two-dimensionally or three-dimensionally. Each of the memory cells MC is, for example, a magnetoresistance change memory cell or a resistance change memory cell. In the embodiments, a magnetoresistance change memory cell being each of the memory cells MC includes an MTJ (Magnetic Tunnel Junction) element 30 as a storage element, and a selection transistor 31. The MTJ element 30 is a magnetic tunnel junction element that can store therein data according to a change in the resistance state and that enables data to be rewritten according to a current. The selection transistor 31 is provided to correspond to the MTJ element 30 and is configured to be brought to a conduction state when a current is passed through the corresponding MTJ element 30. The MTJ element may be referred to as "resistance change element" or "magnetoresistance change element".

As illustrated in FIG. 2, a plurality of word lines WL extend in a row direction and a plurality of bit lines BL extend in a column direction. The word lines WL and the bit lines BL are installed to intersect with each other. Adjacent bit lines BL and source lines SL are paired, respectively, and the memory cells MC are provided to correspond to intersections between the word lines WL and the bit lines BL or the source lines SL, respectively. The MTJ element 30 and the selection transistor 31 of each of the memory cells MC are connected in series between one of the bit lines BL and the associated one of the source lines SL. The gate of each of the selection transistors 31 is connected to one of the word lines WL.

The word line driver 14 is arranged at least along one side of the memory cell array 11. The word line driver 14 is configured to apply a voltage to a word line WL at the time of data read or data write.

The row decoder 15 decodes the address of the command address signal CA supplied from the command address input circuit 18. More specifically, the row decoder 15 supplies a decoded row address to the word line driver 14. This enables the word line driver 14 to apply a voltage to a selected word line WL.

The column decoder 13 decodes the address of the command address signal CA supplied from the command address input circuit 18. The column decoder 13 supplies the decoded column address to the sense amplifier/write driver 12.

The sense amplifier/write driver 12 includes a sense amplifier and a write driver. The sense amplifier/write driver 12 is arranged at least along one side of the memory cell array 11. The sense amplifier is connected to the bit lines BL via global bit lines GBL and detects currents flowing in memory cells MC connected to a selected word line WL to read data stored in the memory cells MC. The write driver is connected to the bit lines BL via the global bit lines GBL or to the source lines SL via global source lines GSL. The write driver passes a current to selected memory cells MC connected to a selected word line WL when data is to be written into the selected memory cells MC.

The sense amplifier/write driver 12 also includes a page buffer (not illustrated). The page buffer is, for example, a volatile memory and stores therein data read by the sense amplifier or write data transferred via the IO circuit 16.

Transmission and reception of data between the sense amplifier/write driver 12 and a data line DQ is performed via the IO circuit 16.

As illustrated in FIG. 2, the memory cell array 11 includes a plurality of memory cells MC arranged in two dimensions or three dimensions. The memory cell array 11 includes a plurality of word lines WL0 to WLi−1 (i is an integer equal to or more than 1), a plurality of bit lines BL0 to BLj−1, and a plurality of source lines SL0 to SLj−1 (j is an integer equal to or more than 1). The memory cells MC are provided to correspond to intersections between the word lines WL and the bit lines BL or the source lines SL, respectively. That is, the memory cell array 11 is a stacked memory cell array.

Each of the memory cells MC is constituted of the MTJ element 30 and the selection transistor 31. The selection transistor 31 is constituted of, for example, an N-type MOSFET (Metal Oxide Silicon Field Effect Transistor).

One end of the MTJ element 30 is connected to a bit line BL and the other end is connected to the drain of the associated selection transistor 31. The gate of the selection transistor 31 is connected to a word line WL and the source thereof is connected to a source line SL.

Figure 3:
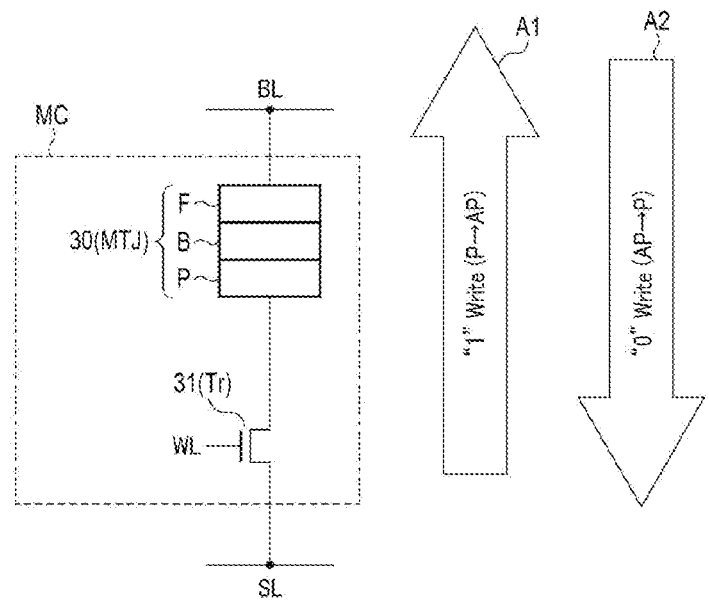
FIG. 3 is an explanatory diagram of the memory cells.

FIG. 3 is an explanatory diagram of the memory cells MC.

The MTJ element 30 based on a TMR (Tunneling Magnetoresistance) effect has a stacked structure including two ferromagnetic layers F and P and a non-magnetic layer (a tunnel dielectric film) B sandwiched therebetween, and stores therein digital data according to a change of the magnetic resistance due to a spin-polarized tunneling effect. The MTJ element 30 can be brought to a low-resistance state and a high-resistance state according to magnetic ordering of the two ferromagnetic layers F and P. For example, when the low-resistance state is defined as data "0" and the high-resistance state is defined as data "1", 1-bit data can be recorded on the MTJ element 30. It is needless to mention that the low-resistance state may be defined as data "1" and the high-resistance state may be defined as data "0".

For example, the MTJ element 30 is configured by sequentially stacking a fixed layer (pinned layer) P, a tunnel barrier layer B, and a recording layer (free layer) F. The pinned layer P is a layer in which the direction of the magnetic ordering is fixed, and the free layer F is a layer in which the direction of the magnetic ordering is variable and stores data therein according to the direction of the magnetization. The pinned layer P and the free layer F are each constituted of a ferromagnetic body and the tunnel barrier layer B is constituted of an insulating film.

For example, cobalt iron boron (CoFeB) or an iron boride (FeB) can be used as the free layer F. For example, cobalt platinum (CoPt), cobalt nickel (CoNi), or cobalt palladium (CoPd) can be used as the pinned layer P. The tunnel barrier layer B is made of a non-magnetic material, and a non-magnetic metal, a non-magnetic semiconductor, or an insulating body can be used therefor. For example, magnesium oxide (MgO) or aluminum oxide ($Al_2O_3$) can be used as the tunnel barrier layer B.

When a current is passed in the direction of an arrow A1 at the time of a write operation, the magnetization direction of the free layer F with respect to that of the pinned layer P is brought to an antiparallel state (AP state), resulting in the high-resistance state (data "1"). This write operation may be referred to as a "1" write operation. When a current is passed in the direction of an arrow A2 at the time of a write operation, the magnetization directions of the pinned layer P and the free layer F are brought to a parallel state (P state), resulting in the low-resistance state (data "0"). This write operation may be referred to as a "0" write operation. In this manner, different data can be written to the MTJ element 30 according to the direction in which a current is passed.

Figure 4:
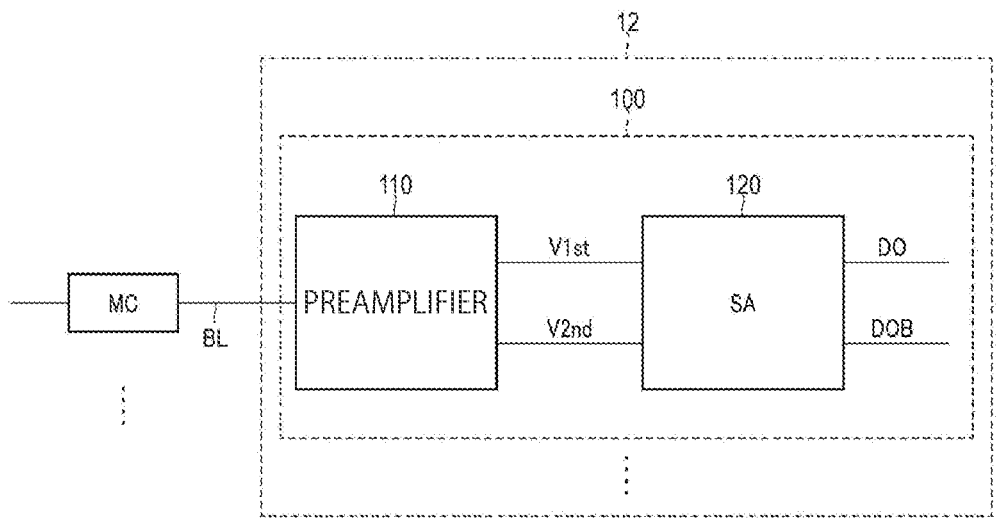
FIG. 4 is a block diagram illustrating a configuration example of a sense circuit in the sense amplifier/write driver according to the first embodiment.

FIG. 4 is a block diagram illustrating a configuration example of a sense circuit 100 in the sense amplifier/write driver 12 according to the first embodiment.

The sense circuit 100 is provided for each of the bit lines (the global bit lines). Each sense circuit 100 includes a preamplifier 110 and a sense amplifier (SA) 120. The preamplifier 110 supplies a current (a cell current) to memory cells MC via the associated bit line and stores therein voltages V1st and V2nd based on the cell current. The sense amplifier 120 determines data (DO, DOB) based on the voltages V1st and V2nd stored in the preamplifier 110.

Figure 5:
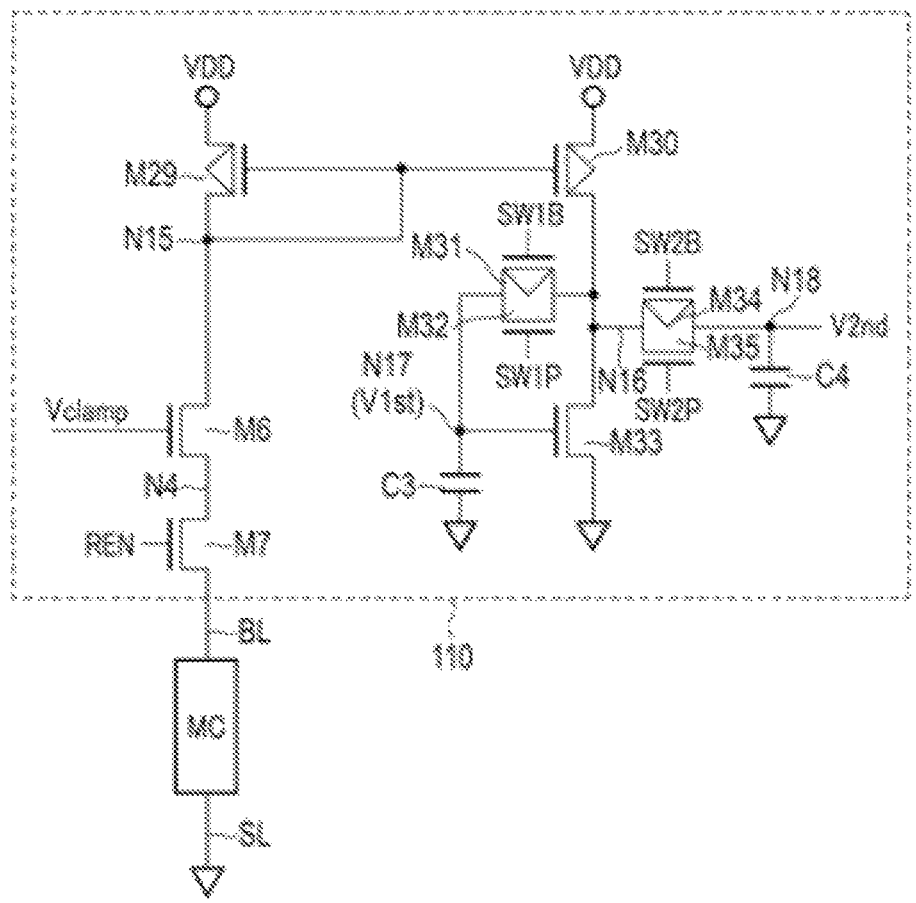
FIG. 5 is a circuit diagram illustrating a configuration example of the preamplifier.

FIG. 5 is a circuit diagram illustrating a configuration example of the preamplifier 110.

The preamplifier 110 includes PMOS transistors M29, M30, M31, and M34, NMOS transistors M6, M7, M32, M33, and M35, and capacitors C3 and C4.

A power supply voltage VDD is applied to one end of the transistor M29 and the other end and the gate electrode thereof are connected to a node N15. The power supply voltage VDD is applied to one end of the transistor M30, the other end thereof is connected to a node N16, and the gate electrode thereof is connected to the node N15. The transistors M29 and M30 constitute a current mirror circuit.

One end of the transistor M6 is connected to the node N15, the other end thereof is connected to a node N4, and the gate electrode receives a signal Vclamp.

One end of the transistor M7 is connected to the node N4, the other end thereof is connected to the associated bit line (global bit line), and the gate electrode thereof receives a read enable signal REN.

One ends of the transistors M31 and M32 are connected to the node N16, and the other ends thereof are connected to a node N17. The gate electrodes of the transistors M31 and M32 receive signals SW1B and SW1P, respectively. The transistors M31 and M32 function as one CMOS (Complementary MOS) switch. The transistors M31 and M32 are referred to also as switches M31 and M32.

One end of the transistor M33 is connected to the node M16, a ground voltage VSS is applied to the other end thereof, and the gate electrode thereof is connected to the node N17.

One end of the capacitor C3 is connected to the node N17 and the other end thereof is connected to a ground voltage source VSS One ends of the transistors M34 and M35 are connected to the node N16, and the other ends thereof are connected to a node N18. The gate electrodes of the transistors M34 and M35 receive signals SW2B and SW2P, respectively. The transistors M34 and M35 function as one CMOS switch. The transistors M34 and M35 are also referred to as switches M34 and M35.

One end of the capacitor C4 is connected to the node N18, and the other end thereof is connected to the ground voltage source VSS.

The voltage of the node N17 is supplied as the voltage V1st to the sense amplifier 120. The voltage V1st is transmitted to the capacitor C3 via the switches M31 and M32. The capacitor C3 can keep the voltage of the node N17 at the voltage V1st. The voltage of the node N18 is supplied as the voltage V2nd to the sense amplifier 120. The voltage V2nd is transmitted to the capacitor C4 via the switches M34 and M35. The capacitor C4 can keep the voltage of the node N18 at the voltage V2nd.

Figure 6:
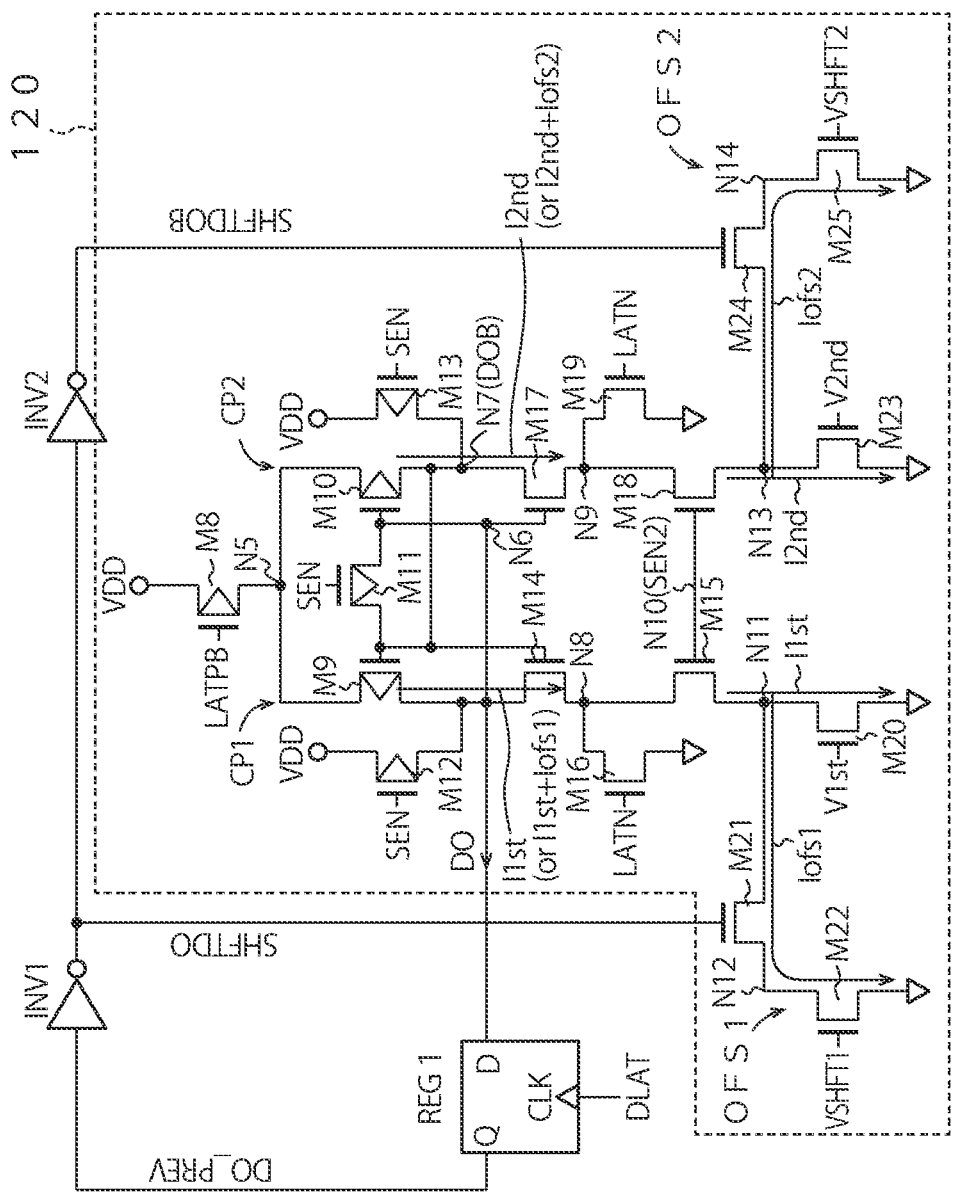
FIG. 6 is a circuit diagram illustrating a configuration example of the sense amplifier.

FIG. 6 is a circuit diagram illustrating a configuration example of the sense amplifier 120.

The sense amplifier 120 includes PMOS transistors M8, M9, M10, M11, M12, and M13, and NMOS transistors M14, M15, M16, M17, M18, M19, M20, M21, M22, M23, M24, and M25. The sense amplifier 120 further includes a register REG1 and inverters INV1 and INV2.

The power supply voltage VDD is applied to one end of the transistor M8, the other end thereof is connected to a node N5, and the gate electrode thereof receives a signal LATPB.

One end of the transistor M9 is connected to the node N5, the other end thereof is connected to a node N6, and the gate electrode thereof is connected to a node N7. The transistor M9 being a first transistor is provided on a current path CP1 and the gate thereof is connected to the node N7 on a current path CP2.

One end of the transistor M10 is connected to the node N5, the other end thereof is connected to the node N7, and the gate electrode thereof is connected to the node N6. The transistor M10 being a second transistor is provided on the current path CP2 and the gate thereof is connected to the node N6 on the current path CP1.

One end of the transistor M11 is connected to the node N6, the other end thereof is connected to the node N7, and the gate electrode thereof receives a signal SEN.

The power supply voltage VDD is applied to one end of the transistor M12, the other end thereof is connected to the node N6, and the gate electrode thereof receives the signal SEN.

The power supply voltage VDD is applied to one end of the transistor 13, the other end thereof is connected to the node N7, and the gate electrode thereof receives the signal SEN.

One end of the transistor M14 is connected to the node N6, the other end thereof is connected to a node N8, and the gate electrode thereof is connected to the node N7. The transistor M14 being a first transistor is provided on the current path CP1 and the gate thereof is connected to the node N7 on the current path CP2.

One end of the transistor M15 is connected to the node N8, the other end thereof is connected to a node N11, and the gate electrode thereof receive a signal SEN2 via a node N10.

One end of the transistor M16 is connected to the node N8, the ground voltage VSS is applied to the other end thereof, and the gate electrode thereof receives a signal LATN.

One end of the transistor M17 is connected to the node N7, the other end thereof is connected to a node N9, and the gate electrode thereof is connected to the node N6. The transistor M17 being a second transistor is provided on the current path CP2 and the gate thereof is connected to the node N6 on the current path CP1.

One end of the transistor M18 is connected to the node N9, the other end thereof is connected to a node N13, and the gate electrode thereof receives the signal SEN2 via the node N10.

One end of the transistor M19 is connected to the node N9, the ground voltage VSS is applied to the other end thereof, and the gate electrode receives the signal LATN.

One end of the transistor M20 is connected to the node N11, the ground voltage VSS is applied to the other end thereof, and the gate electrode thereof receives a signal V1st.

One end of the transistor M21 is connected to the node N11, the other end thereof is connected to a node N12, and the gate electrode thereof receives a signal SHFTDO.

One end of the transistor M22 is connected to the node N12, the ground voltage VSS is applied to the other end thereof, and the gate electrode thereof receives a shift voltage VSHFT1.

One end of the transistor M23 is connected to the node N13, the ground voltage VSS is applied to the other end thereof, and the gate electrode thereof receives a signal V2nd.

One end of the transistor M24 is connected to the node N13, the other end thereof is connected to a node N14, and the gate electrode thereof receives a signal SHFTDOB.

One end of the transistor M25 is connected to the node N14, the ground voltage VSS is applied to the other end thereof, and the gate electrode thereof receives a shift voltage VSHFT2.

In this sense amplifier 120, the transistors M9, M14, M15, and M20 constitute the current path CP1. The transistors M10, M17, M18, and M23 constitute the current path CP2. The gates of the transistors M9 and M14 on the current path CP1 are connected in common to the node N7 of the current path CP2, and the gates of the transistors M10 and M17 on the current path CP2 are connected in common to the node N6 of the current path CP1. The node N6 is a node between the transistors M9 and M14 and the node N7 is a node between the transistors M10 and M17. That is, the gates of the transistors M9 and M14 and the gates of the transistors M10 and M17 are cross-coupled. This enables the sense amplifier 120 to function as a differential amplification circuit. The current path CP1 passes a current I1st corresponding to the voltage V1st of the node N17. The current path CP2 passes a current I2nd corresponding to the voltage V2nd of the node N18. The sense amplifier 120 outputs an output signal DO corresponding to a voltage difference between the node N17 and the node N18 from an output part. The signal SEN needs to be at a high level and the transistors M11 to M13 need to be OFF when the sense amplifier 120 functions as the differential amplification circuit.

The transistors M21 and M22 constitute an offset part OFS1 connected to the current path CP1. The offset part OFS1 branches off from the node N11 between the transistors M15 and M20 and can pass an offset current Iofs1 according to the shift voltage (first shift voltage) VSHFT1. The transistor M22 being a first offset transistor passes the offset current Iofs1 when the shift voltage VSHFT1 is applied to the gate. The transistor M22 can pass the offset current Iofs1 when the transistor M21 is ON in the offset part OFS1.

The transistors M24 and M25 constitute an offset part OFS2 connected to the current path CP2. The offset part OFS2 branches off from the node N13 between the transistors M18 and M23 and can pass an offset current Iofs2 according to the shift voltage (second shift voltage) VSHFT2. The transistor M25 being a second offset transistor passes the offset current Iofs2 when the shift voltage VSHFT2 is applied to the gate. The transistor M25 can pass the offset current Iofs2 when the transistor M24 is ON in the offset part OFS2.

The shift voltages VSHFT1 and VSHFT2 respectively control conduction states of the transistors M22 and M25 to pass the predetermined offset current Iofs1 or Iofs2 to the transistor M22 or M25. When the transistor M22 passes the offset current Iofs1, the current I1st flowing through the current path CP1 increases by the offset current Iofs1. That is, the current flowing through the current path PC1 becomes I1st+Iofs1. This is apparently identical to a state where the voltage V1st is shifted to a high voltage side. On the other hand, when the transistor M25 passes the offset current Iofs2, the current CP2 flowing through the current path CP2 increases by the offset current Iofs2. That is, the current flowing through the current path CP2 becomes I2nd+Ioft2. This is apparently identical to a state where the voltage V2nd is shifted to a high voltage side. That is, it is deemed that the voltage V1st is increased by an offset voltage Vofs1 corresponding to the offset current Iofs1 due to passage of the offset current Iofs1. It is deemed that the voltage V2nd is increased by an offset voltage Vofs2 corresponding to the offset current Iofs2 due to passage of the offset current Iofs2.

Shift amounts of the voltages V1st and V2nd corresponding to the offset currents Iofs1 and Iofs2 are the offset voltages Vofs1 and Vofs2, respectively. The offset current Iofs1 is any current (for example, a substantially intermediate current) between a current flowing through the current path CP1 in the case of data "0" and a current flowing through the current path CP1 in the case of data "1". The offset current Iofs2 is any current (for example, a substantially intermediate current) between a current flowing through the current path CP2 in the case of the data "0" and a current flowing through the current path CP2 in the case of the data "1". The offset voltage Vofs1 can be any voltage (a substantially intermediate voltage) between the voltage V1st of the node N17 (see FIG. 5) in the case of the data "0" and the voltage V1st of the node N17 in the case of the data "1". The offset voltage Vofs2 can be any voltage (a substantially intermediate voltage) between the voltage V2nd of the node N18 in the case of the data "0" and the voltage V2nd of the node N18 in the case of the data "1". The shift voltages VSHFT1 and VSHFT2 are set so as to enable the transistors M22 and M25 to pass the offset currents Iofs1 and Iofs2 to shift the voltages V1st and V2nd by the offset voltages Vosf1 and Vofs2, respectively. The offset voltages Vosf1 and Vosf2 are both substantially intermediate voltages between the data "0" and the data "1" and may be voltages equal to each other.

The shift voltage VSHFT1 may be a gate voltage that causes a current equal to or less than (for example, a current about a half of) a difference current between the current flowing through the current path CP1 in the case of the data "0" and the current flowing through the current path CP1 in the case of the data "1" to pass through the transistor M22. The offset voltage Vofs2 may be a voltage that causes the transistor M25 to pass a current equal to or less than (for example, a current about a half of) a difference current between the current flowing through the current path CP2 in the case of the data "0" and the current flowing through the current path CP2 in the case of the data "1".

In the sense amplifier 120, there is a voltage difference between the nodes N6 and N7 due to the current I1st (or I1st+Iofs1) and the current I2nd (or I2nd+Iofs2) respectively flowing through the current paths CP1 and CP2. The voltage difference between the nodes N6 and N7 is greatly expanded by the transistors M9 and M14 and the transistors M10 and M17 cross-coupled. Accordingly, the voltage difference between the nodes N6 and N7 becomes a voltage difference between logic levels that are complementary with each other. The voltage of the node N6 is supplied as the output signal DO to the IO circuit 16 in FIG. 1. The voltage of the node N7 is supplied as an inverted output signal DOB of the output signal DO to the IO circuit 16 in FIG. 1. The output signal DO is input to the register REG1 and is latched by the register REG1 at the timing of a latch signal DLAT.

The register REG1 being a first register includes an input part connected to the node N6, an output part connected to the inverter INV1, and a clock input part to which the latch signal DLAT is input. The register REG1 latches the output signal DO, for example, at a timing when the latch signal DLAT has risen to a high level, and outputs the output signal DO as a hold signal DO_PREV.

The inverter INV1 is connected between the register REG1 and the gate of the transistor M21. The inverter INV1 provides the offset signal SHFTDO, which is obtained by inverting the hold signal DO_PREV from the register REG1, to the gate of the transistor M21.

The inverter INV2 is connected between the output of the inverter INV1 and the gate of the transistor M24. The inverter INV2 provides the offset signal SHFTDOB, which is obtained by inverting the offset signal SHFTDO from the inverter INV1, to the gate of the transistor M24.

Accordingly, one of the transistors M21 and M24 is turned ON and the other thereof is turned OFF according to the hold signal DO_PREV latched by the register REG1. When the transistor M21 is turned ON, the offset current flows in the current path CP1. This case is equivalent to an increase of the voltage V1st by the offset voltage Vofs as described above. When the transistor M24 is turned ON, the offset current flows in the current path CP2. This case is equivalent to an increase of the voltage V2nd by the offset voltage Vofs. Since the offset voltage Vofs is a substantially intermediate voltage between the data "0" and the data "1", the voltage V1st or V2nd can be set to a substantially intermediate voltage between the data "0" and the data "1" by shifting the voltage V1st or V2n by the offset voltage Vofs. Alternatively, either one of the voltages V1st and V2nd that are at approximately same levels may be shifted to a high voltage side. Therefore, after shifted by the offset voltage Vofs, one of the voltages V1st and V2nd can be used as a reference voltage to detect the other voltage.

For example, data detected in a certain read operation is held as the voltage V1st in the node N17 and data detected in the next read operation is held as the voltage V2nd in the node N18. At this time, the voltage V1st is output as the hold signal DO_PREV and one of the offset parts OFS1 and OFS2 passes the offset current Iofs1 or Iofs2 according to the voltage level of the voltage V1st.

When the voltage V1st is at a low level and the hold signal DO_PREV is at a low level, the transistor M21 is turned ON and the offset part OFS1 passes the offset current Iofs1 to the current path CP1. On the other hand, when the voltage V1st is at a high level and the hold signal DO_PREV is at a high level, the transistor M24 is turned ON and the offset part OFS2 passes the offset current Iofs2 to the current path CP2.

In this manner, the sense amplifier 120 increases either the voltage V1st or the voltage V2nd by the offset voltage Vofs on the basis of the logic level (the voltage level of the voltage V1st) of read data of the previous time. Accordingly, the sense amplifier 120 can detect read data (the voltage V2nd) of this time using the read data (the voltage V1st) of the previous time as a reference signal.

A read operation performed by the preamplifier 110 and the sense amplifier 120 according to the present embodiment is explained in more detail below.

Figure 7:
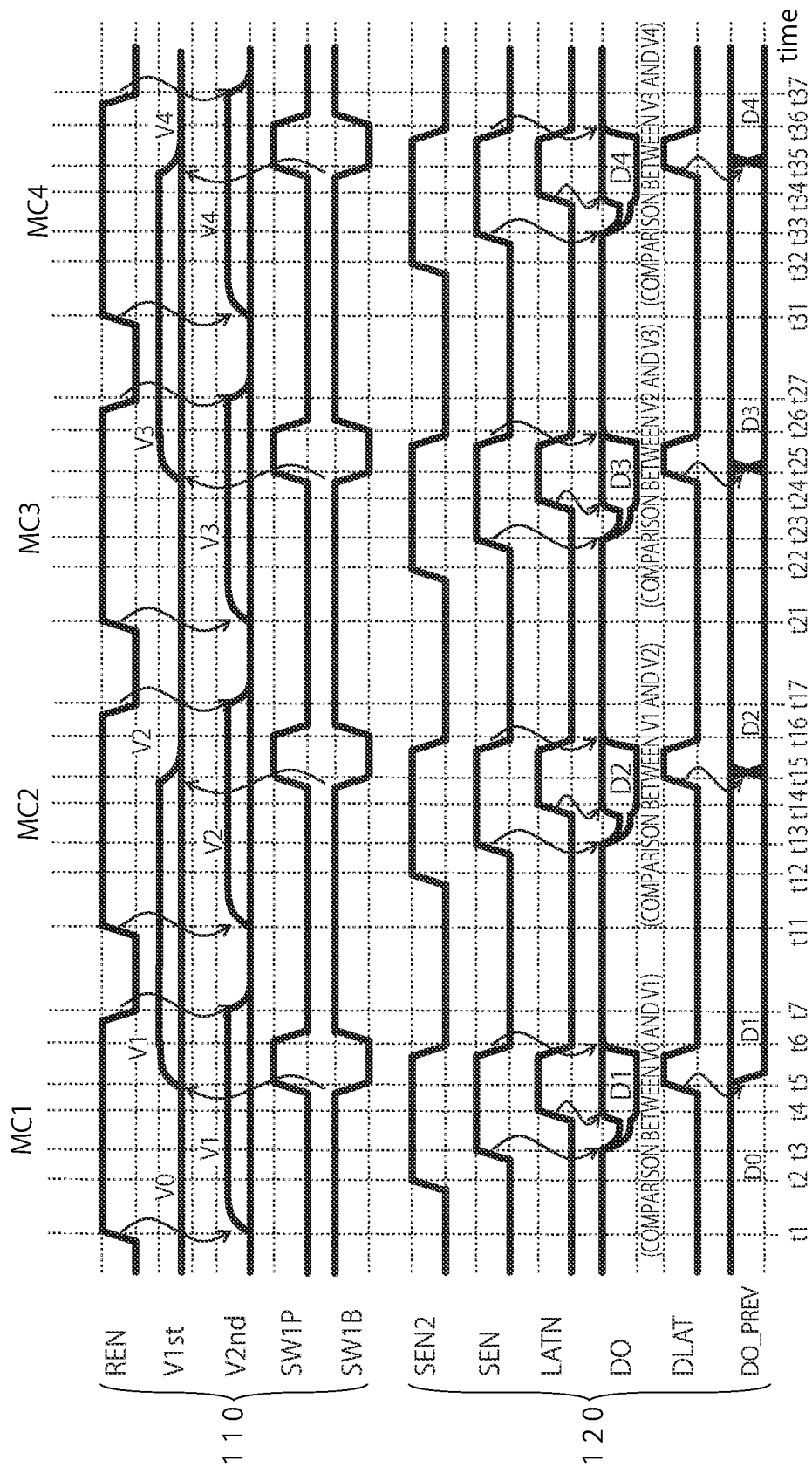
FIG. 7 is a timing chart illustrating an example of the read operation performed by the preamplifier and the sense amplifier.

FIG. 7 is a timing chart illustrating an example of the read operation performed by the preamplifier 110 and the sense amplifier 120. FIGS. 8A to 9C are conceptual diagrams illustrating an example of the read operation.

As illustrated in FIGS. 5 and 6, the signal Vclamp keeps a high level, the signal LATPB keeps a low level, the signal SW2P keeps a high level, and the signal SW2B keeps a low level in the read operation. Therefore, the transistor M6 and the switches M34 and M35 of the preamplifier 110, and the transistor M8 of the sense amplifier 120 are kept in the conduction state (ON) during the read operation. The shift voltages VSHFT1 and VSHFT2 are kept at predetermined voltages to enable the transistors M22 and M25 to pass the predetermined offset currents Iofs1 and Iofs2, respectively. Therefore, timing charts of these signals are omitted in FIG. 7.

In an initial state before t1, the signal SW1P is at a low level and the signal SW1B is at a high level. The signals REN, SEN, SEN2, and LATN are at a low level. The transistor M7 and the switches M31 and M32 of the preamplifier 110 are in the non-conduction state (OFF). The transistors M11 to M13 of the sense amplifier 120 are ON and the transistors M15, M16, M18, and M19 are OFF.

Since the transistors M11 to M13 are ON in the initial state, the nodes N6 and N7 are charged to a high level and the output signal DO in the initial state has a high level. The transistors M14 and M17 are turned ON while the transistors M9 and M10 are turned OFF.

It is assumed that the register REG1 latches a high level as the hold signal DO_PREV in the initial state. In this case, the transistor M21 is OFF and the transistor M24 is ON. Since the transistors M15 and M18 are OFF in the initial state before t1, the offset currents Iofs1 and Ifos2 do not flow in the sense amplifier 120 yet. The output signal DO in the initial state is set by reading a certain initial memory cell that has known data stored therein. The initial memory cell is a first read target. At this time, the location of the initial memory cell is predetermined and the initial memory cell has known initial data (for example, data "1") stored therein. Accordingly, the data of the initial memory cell can be read by a self-reference method or may be read using a reference signal appropriate for the initial memory cell. It is needless to mention that, the output signal DO and the hold signal DO_PREV in the initial state may be at a low level.

In the following descriptions, it is assumed that the read operation is performed in the order of memory cells MC1 to MC4.

(Read Operation on Memory Cell MC1)

First, data in the memory cell MC1 is read. When the read enable signal REN rises to a high level at t1, the transistor M7 is turned ON and a memory current corresponding to the data (resistance) in the memory cell MC1 flows in the current path of the transistors M29, M6, and M7. The transistors M29 and M30 function as a current mirror and a mirror current corresponding to the memory current flows in the current path of the transistors M30 and M33. At this time, the switches M31 and M32 are OFF and the switches M34 and M35 are ON. Therefore, the voltage of the node N16 is output as the voltage V2nd to the sense amplifier 120 illustrated in FIG. 6 and is accumulated in the capacitor C4. Accordingly, the voltage V2nd changes to the voltage V1 corresponding to the data in the memory cell MC1 while the voltage V1st remains unchanged (for example, V0). For example, when the memory cell MC1 has a low resistance, the memory current and the mirror current are increased and therefore the voltage V2nd has a high level higher than the voltage V1st. When the memory cell MC1 has a high resistance, the memory current and the mirror current are decreased and therefore the voltage V2nd has a low level lower than the voltage V1st.

Next, at t2, the signal SEN2 of the sense amplifier 120 is raised to a high level to turn the transistors M15 and M18 ON.

Next, at t3, the signal SEN of the sense amplifier 120 is raised to a high level to turn the transistors M11 to M13 OFF. Accordingly, the current from the power source VDD flows in the current paths CP1 and CP2 via the transistor M8. The current I1st flowing in the current path CP1 is determined by a resistance state of the transistor M20 controlled by the voltage V1st. Further, when the transistor M21 is ON, the offset current Iofs1 additionally flows in the current path CP1. The current I2nd flowing in the current path CP2 is determined by a resistance state of the transistor M23 controlled by the voltage V2nd. Further, when the transistor M24 is ON, the offset current Iofs2 additionally flows in the current path CP2.

A method of detecting data in the memory cell MC1 when the hold signal DO_PREV is at a high level is explained below with reference to FIGS. 8A to 8C. In graphs of FIGS. 8A to 8C, the horizontal axis represents the levels of data in voltages V1s and V2nd (that is, the logic levels of data in memory cells), and the vertical axis represents the number of memory cells (the frequency). A parallel state (a P state) is a low resistance state of a memory cell and indicates, for example, a low level (data "0") of the voltage V1st or V2nd. An antiparallel state (an AP state) is a high resistance state of a memory cell and indicates, for example, a high level (data "1") of the voltage V1st or V2nd.

Figure 8A:
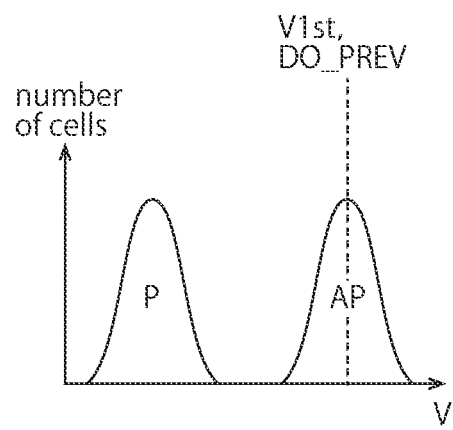
FIGS. 8A to 9C are conceptual diagrams illustrating an example of the read operation.

When the hold signal DO_PREV is at a high level in the initial state as illustrated in FIG. 8A, the offset part OFS2 in FIG. 6 passes the offset current Iofs2 to the current path CP2. At this time, the offset part OFS1 does not pass the offset current Iofs1. In this case, it is deemed that the voltage V2nd corresponding to the memory cell MC1 being the detection target is increased by the offset voltage Vofs2 as illustrated in FIG. 8B. The sense amplifier 120 compares a voltage V2nd+Vofs2 with the voltage V1st at a high level. That is, the sense amplifier 120 compares the voltage of the gates (the node N7) of the transistors M9 and M14, which is shifted and reduced by the offset current Iofs2, with the voltage of the gates (the node N6) of the transistors M10 and M17, which is not shifted.

Figure 8B:
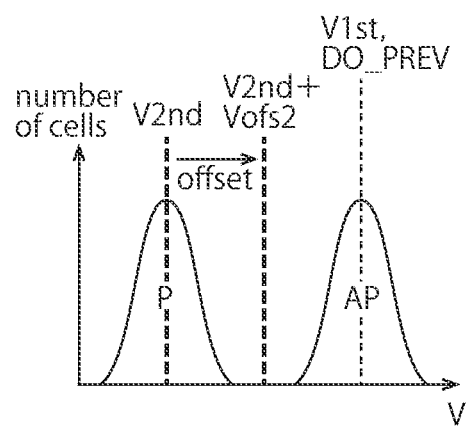

When the logic level of the data in the memory cell MC1 is "0" and the voltage V2nd is at a low level at this time, the voltage V2nd is offset to a substantially intermediate voltage (V2nd+Vofs2) between the high-level voltage V1st and the low-level voltage V2nd as illustrated in FIG. 8B. Therefore, the sense amplifier 120 can detect that the voltage V2nd is at a low level by comparing the intermediate voltage V2nd+Vofs2 with the high-level voltage V1st. That is, the sense amplifier 120 can detect that the data in the memory cell MC1 is "0".

Figure 8C:
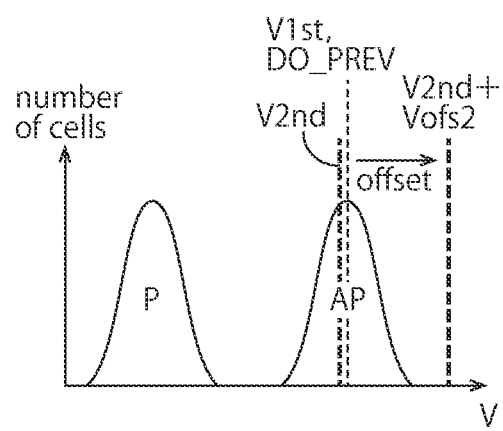

On the other hand, when the logic level of the data in the memory cell MC1 is "1" and the voltage V2nd is at a high level, the voltage V2nd is offset to a voltage V2nd+Vofs2 higher than the high-level voltages V1st and V2nd by the offset voltage Vofs2 as illustrated in FIG. 8C. That is, when the voltages V1st and V2nd are both at a high level, there is a risk that the voltage V1st and the voltage V2nd cannot be discriminated. However, according to the present embodiment, the high-level voltage V2nd is offset to the voltage V2nd+Vofs2 higher by the offset voltage Vofs2. Therefore, the sense amplifier 120 can detect that the voltage V2nd is at a high level by comparing the voltage V2nd+Vofs2 with the high-level voltage V1st. That is, the sense amplifier 120 can detect that the data in the memory cell MC1 is "1".

In this manner, the sense amplifier 120 can detect the data in the memory cell MC using the voltage V1st of the node N17 in the initial state as the reference signal.

Referring back to FIG. 7, a voltage difference between the node N6 and the node N7 appears in the output signal DO from t3 to t4. The voltage difference between the node N6 and the node N7 depends on the current I1st or I1st+Iofs1 flowing through the current path CP1 and the current I2nd or I2nd+Iofs2 flowing through the current path CP2. Further, these currents flowing through the current paths CP1 and CP2 are determined by the voltages V1st and V2nd and the hold signal DO_PREV. In this manner, the voltage difference between the voltage V2nd+Vofs2 and the voltage V1st appears in the output signal DO.

At t4, the signal LATN is raised to a high level to turn the transistors M16 and M19 ON, thereby further expanding the voltage difference between the node N6 and the node N7. When the logic level of the data in the memory cell MC1 is "0" and the voltage V2nd is at a low level at this time, the output signal DO has a low level. When the logic level of the data in the memory cell MC1 is "1" and the voltage V2nd is at a high level, the output signal DO has a high level.

Next, at t5, the signals SW1P and SW1B of the preamplifier 110 in FIG. 5 have a high level and a low level, respectively, whereby the switches M31 and M32 are turned ON. Accordingly, the data in the memory cell MC1 is transmitted also to the node N17 and the voltage V1st becomes a voltage corresponding to the data in the memory cell MC1 similarly to the voltage V2nd. The capacitor C3 is charged with the voltage corresponding to the data in the memory cell MC1. The latch signal DLAT has a high level and the register REG1 in FIG. 6 latches the output signal DO as the hold signal DO_PREV. Therefore, the output signal DO being a detection result of the data in the memory cell MC1 is held as the hold signal DO_PREV.

Next, at t6, the signals SEN, SEN2, LATN, and DLAT fall to a low level. Accordingly, the transistors M11 to M13 are turned ON and the transistors M15, M16, M18, and M19 are turned OFF. Therefore, the currents I1st and I2nd of the current paths CP1 and CP2 stop and the nodes N6 and N7 are reset to a same voltage. However, due to inactivation of the latch signal DLAT to a low level, the register REG1 keeps the logic level of the data in the memory cell MC1 as the hold signal DO_PREV without depending on the output signal DO.

Further, the signals SW1P and SW1B have a low level and a high level, respectively, and the switches M31 and M32 are turned OFF. However, the capacitor C3 keeps the voltage V1st of the node N17 at a voltage corresponding to the data in the memory cell MC1. That is, the hold signal DO_PREV and the voltage V1st of the node N17 keep the logic level of the data in the memory cell MC1. Meanwhile, the voltage V2nd of the node N18 and the output signals DO and DOB of the nodes N6 and N7 are reset.

Next, at t7, the read enable signal REN falls to a low level. The read operation on the memory cell MC1 thereby ends.

(Read Operation on Memory Cell MC2)

Next, a read operation is performed to the memory cell MC2 in an identical manner. Operations from t11 to t17 can be basically same as those from t1 to t7. However, at the time of data detection from t13 to t14, the hold signal DO_PREV and the voltage V1st of the node N17 keep the logic level of the data in the memory cell MC1 and data in the memory cell MC2 is transmitted to the voltage V2nd of the node N18.

For example, when the logic level of the data in the memory cell MC1 is "1" and the hold signal DO_PREV is at a high level, the offset part OFS2 passes the offset current Iofs2 to the current path CP2 in detection of the data in the memory cell MC2. It is deemed that the voltage of the node N18 corresponding to the data in the memory cell MC2 is accordingly offset to the voltage V2nd+Vofs2. Therefore, the sense amplifier 120 can detect the data in the memory cell MC2 by comparing the voltage V2nd+Vofs2 with the voltage V1st. This is same as the operation explained with reference to FIG. 8. The sense amplifier 120 apparently offsets the voltage V2nd corresponding to the data in the memory cell MC2 to the voltage V2nd+Vosf2 on the basis of the hold signal DO_PREV (the data in the memory cell MC1) latched by the register REG1. Accordingly, the data in the memory cell MC2 can be detected using the voltage V1st corresponding to the data in the memory cell MC1 as the reference voltage.

On the other hand, when the logic level of the data in the memory cell MC1 is "0" and the hold signal DO_PREV is at a low level, the offset part OFS1 passes the offset current Iofs1 to the current path CP1. Accordingly, it is deemed that the voltage of the node N17 corresponding to the data in the memory cell MC1 is offset to a voltage V1st+Vofs1.

A method of detecting the data in the memory cell MC2 when the hold signal DO_PREV is at a low level is explained below with reference to FIGS. 9A to 9C. The horizontal axes and the vertical axes in graphs of FIGS. 9A to 9C are same as those in FIGS. 8A to 8C.

Figure 9A:
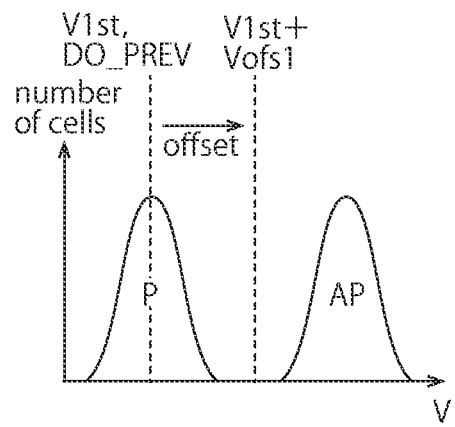

As illustrated in FIG. 9A, when the hold signal DO_PREV is at a low level, the offset part OFS1 in FIG. 6 passes the offset current Iofs1 to the current path CP1. At this time, the offset part OFS2 does not pass the offset current Iofs2. In this case, it is deemed that the data (the voltage V1st) in the memory cell MC having already been read and held in the node N17 is increased by the offset voltage Vofs1. In this case, it is deemed that the voltage V1st is offset to a substantially intermediate voltage V1st+Vofs1 between the high level and the low level as illustrated in FIG. 9A. The sense amplifier 120 compares the intermediate voltage V1st+Vofs1 as the reference voltage with the voltage V2nd. That is, the sense amplifier 120 compares the voltage of the gates (the node N6) of the transistors M10 and M17, which has been shifted by the offset voltage Iofs1 and reduced, with the voltage of the gates (the node N7) of the transistors M9 and M14, which is not shifted. The hold signal DO_PREV keeps the state (a low level) latched by the register REG1.

Figure 9B:
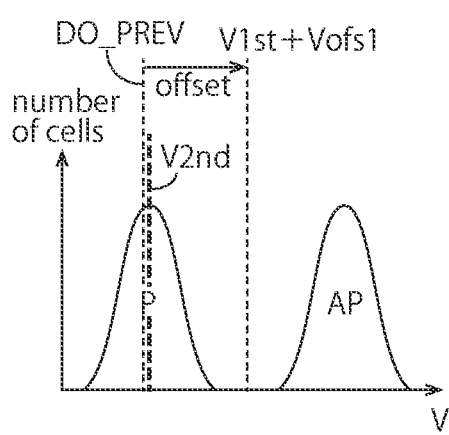

When the logic level of the data in the memory cell MC2 is "0" and the voltage V2nd is at a low level at this time, the sense amplifier 120 shifts the low-level voltage V1st to the intermediate voltage V1st+Vofs1 as illustrated in FIG. 9B and compares the intermediate voltage V1st+Vosft1 with the low-level voltage V2nd. Since this causes the voltage V1s to be separated from a level near the voltage V2nd to the intermediate voltage V1st+Vofs1, the sense amplifier 120 can detect that the voltage V2nd is at a low level (the data "0").

Figure 9C:
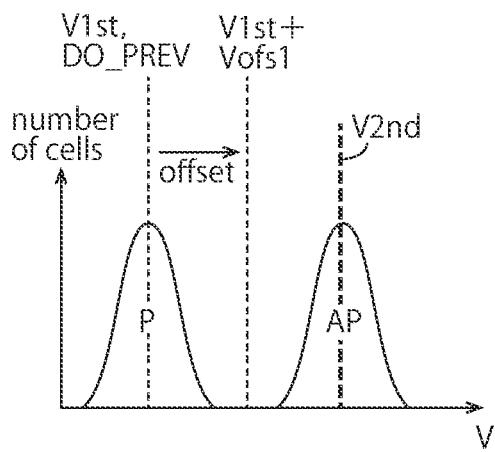

On the other hand, when the logic level of the data in the memory cell MC2 is "1" and the voltage V2nd is at a high level, the sense amplifier 120 compares the offset intermediate voltage V1st+Vofs1 with the high-level voltage V2nd as illustrated in FIG. 9C. This causes the voltage V1st to approach the voltage V2nd. However, it is still sufficiently away from the voltage V2nd and therefore the sense amplifier 120 can detect that the voltage V2nd is at a high level (the data "1").

In this manner, the sense amplifier 120 can detect the data in the memory cell MC2 using the intermediate voltage V1st+Vofs1 as the reference signal.

Subsequent operations from t14 to t17 can be same as those from t4 to t7.

(Read Operation on Memory Cell MC3)

Next, a read operation is performed to the memory cell MC3 in an identical manner. Operations from t21 to t27 can be basically same as those from t1 to t7. However, at the time of data detection from t23 to t24, the hold signal DO_PREV and the voltage V1st of the node N17 keep the logic level of the data in the memory cell MC2 and data in the memory cell MC3 is transmitted to the voltage V2nd of the node N18.

For example, when the logic level of the data in the memory cell MC2 is "1" and the hold signal DO_PREV is at a high level, the offset part OFS2 passes the offset current Iofs2 to the current path CP2 in detection of the data in the memory cell MC3. It is deemed that this causes the voltage of the node N18 corresponding to the data in the memory cell MC3 to be offset to the voltage V2nd+Vofs2. Therefore, the sense amplifier 120 can detect the data in the memory cell MC3 by comparing the voltage V2nd+Vofs2 with the voltage V1st. This is same as the operation explained with reference to FIG. 8. The sense amplifier 120 apparently offsets the voltage V2nd corresponding to the data in the memory cell MC3 to the voltage V2nd+Vofs2 on the basis of the hold signal DO_PREV (the data in the memory cell MC2) latched by the register REG1. Accordingly, the data in the memory cell MC3 can be detected using the voltage V1st corresponding to the data in the memory cell MC2 as the reference voltage.

For example, when the logic level of the data in the memory cell MC2 is "0" and the hold signal DO_PREV is at a low level, the offset part OFS1 passes the offset current Iofs1 to the current path CP1 in detection of the data in the memory cell MC3. It is deemed that the voltage of the node N17 corresponding to the data in the memory cell MC2 is accordingly offset to the voltage V1st+Vofs1. Therefore, the sense amplifier 120 can detect the data in the memory cell MC3 by comparing the voltage V1st+Vofs1 with the voltage V2nd. This is same as the operation explained with reference to FIG. 9. The sense amplifier 120 apparently offsets the voltage V1st corresponding to the data in the memory cell MC2 to the voltage V1st+Vofs1 on the basis of the hold signal DO_PREV (the data in the memory cell MC2) latched by the register REG1. Therefore, the data in the memory cell MC3 can be detected using the voltage V1st corresponding to the data in the memory cell MC2 as the reference voltage.

(Read Operation on Memory Cell MC4)

Next, a read operation is performed to the memory cell MC4 in an identical manner. Operations from t31 to t37 can be basically same as those from t1 to t7. However, at the time of data detection from t33 to t34, the hold signal DO_PREV and the voltage V1st of the node N17 keep the logic level of the data in the memory cell MC3 and data in the memory cell MC4 is transmitted to the voltage V2nd of the node N18. The rest of the read operation on the memory cell MC4 can be identical to that on the memory cell MC3.

Accordingly, the sense amplifier 120 can detect the data in the memory cell MC4 using the voltage V1st corresponding to the data in the memory cell MC3 as the reference voltage.

While FIG. 7 illustrates only the read operations on the memory cells MC1 to MC4, data in a memory cell MC5 and subsequent memory cells can be read in an identical manner. In this case, the sense amplifier 120 uses the voltage V1st corresponding to data in a memory cell MCk−1 (k≥1) as the reference voltage to detect data in a memory cell MCk.

In the embodiment described above, the initial memory cell has stored therein high-level data of the data "1". However, the initial memory cell may have stored therein low-level data of the data "0". In this case, it suffices that the sense amplifier 120 shifts the voltage V1st in the initial state to the offset voltage V1st+Vofs1 and detects the voltage V2nd corresponding to data in the memory cell MC1 using the offset voltage V1st+Vofs1 as the reference voltage as explained with reference to FIG. 9. As described above, the data in the initial memory cell may be either "0" or "1".

The sense amplifier 120 according to the present embodiment detects read data (the voltage V2nd) of the current time while using immediately preceding read data (the voltage V1st) as the reference signal. However, the sense amplifier 120 may use more preceding read data as the reference signal. In this case, it suffices to hold read data of a cell two or more cells before as the data (the voltage V1st) held in the node N17. It suffices that a memory cell being a read target of the current time is located near a read target memory cell that is two or more cells before.

FIGS. 10A to 10D are conceptual diagrams illustrating reading orders of memory cells MC.

As described above, the sense amplifier 120 detects the data in the memory cell MC1 using the voltage V1st corresponding to the known data in the initial memory cell or the offset voltage V1st+Vofs1 as the reference voltage. Similarly, the sense amplifier 120 detects data in a memory cell MCk using data in a memory cell MCk−1 as reference data.

In the memory cell array 11, the memory cell MCk is arranged near the memory cell MCk−1 and is preferably a cell adjacent to the memory cell MCk−1. Because of the arrangement of the memory cell MCk near or adjacent to the memory cell MCk−1, electrical properties of the memory cell MCk and the memory cell MCk−1 are close and similar to each other. Since the wiring distances from the driver 14, the sense circuit 100, or the like to the memory cell MCk and the memory cell MCk−1 are not so different from each other, the wiring resistances are substantially equal to each other. Therefore, the sense amplifier 120 can correctly detect the data in the memory cell MCk using the data in the memory cell MCk−1 as the reference data.

For example, FIGS. 11A to 12C are conceptual diagrams illustrating other examples of the read operation.

Figure 11A:
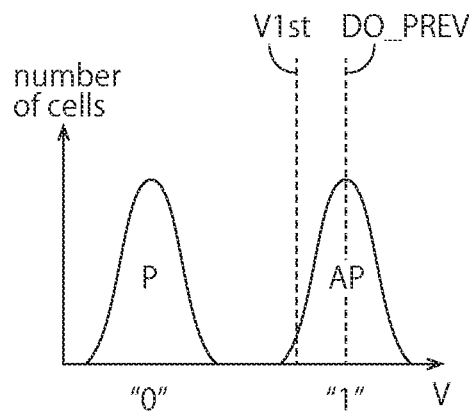
FIGS. 11A to 12C are conceptual diagrams illustrating other examples of the read operation.
Figure 11B:
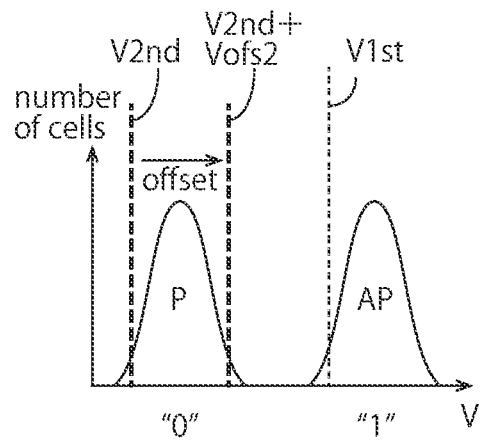

When the voltage V1st corresponding to data in the memory cell MCk−1 is located on the lower end of the distribution of the data "1" as illustrated in FIG. 11A, it is considered that the memory cell MCk near the memory cell MCk−1 also has an identical property to that of the memory cell MCk−1. That is, the voltage V2nd corresponding to data in the memory cell MCk is highly likely to be also located on the lower end of the distribution of the data "1" or "0". Therefore, when the data in the memory cell MCk is "0", the voltage V2nd is located on the lower end of the distribution of the data "0" as illustrated in FIG. 11B. The sense amplifier 120 apparently offsets the voltage V2nd corresponding to the data in the memory cell MCk to the voltage V2nd+Vofs2 on the basis of the hold signal DO_PREV. Since the data in the memory cells MCk−1 and MCk are located on the lower ends of the distributions of the data "1" and "0", respectively, the data (the voltage V2nd+Vofs2) of the memory cell MCk can be detected using the voltage V1st corresponding to the data in the memory cell MCk−1 as the reference voltage. Since the hold signal DO_PREV is a signal after detection by the sense amplifier 120, it is located at a substantially center of the distribution.

Figure 11C:
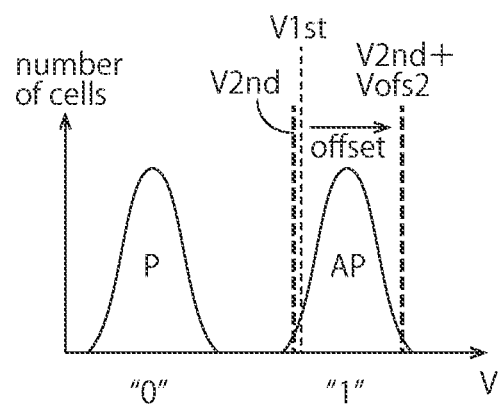

When the data in the memory cell MCk is "1", the voltage V2nd is located on the lower end of the distribution of the data "1" as illustrated in FIG. 11C. The sense amplifier 120 apparently offsets the voltage V2nd corresponding to the data in the memory cell MCk to the voltage V2nd+Vofs2 on the basis of the hold signal DO_PREV. Since the data in the memory cells MCk−1 and MCk are both located on the lower end of the distribution of the data "1", the data (the voltage V2nd+Vofs2) in the memory cell MCk can be detected using the voltage V1st corresponding to the data in the memory cell MCk−1 as the reference voltage.

While the data in the memory cells MCk−1 and MCk are respectively located on the lower ends of associated distributions in the specific examples illustrated in FIGS. 11A to 11C, the same holds for a case in which the data in the memory cells MCk−1 and MCk are respectively located on the upper ends of the associated distributions.

Figure 12A:
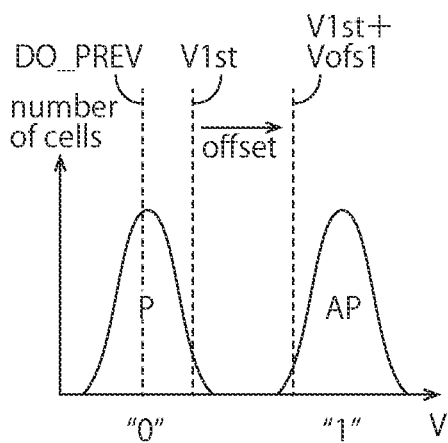
Figure 12B:
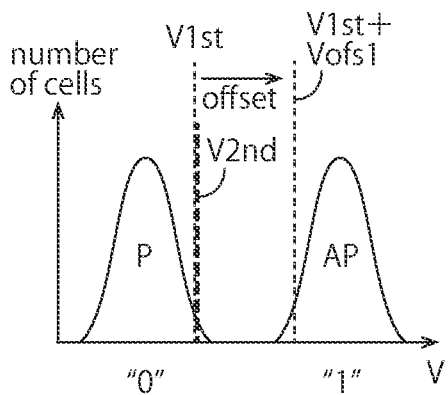

As illustrated in FIG. 12A, when the voltage V1st corresponding to data in the memory cell MCk−1 is located on the upper end of the distribution of the data "0", it is considered that the memory cell MCk near the memory cell MCk−1 also has a property identical to that of the memory cell MCk−1. That is, the voltage V2nd corresponding to data in the memory cell MCk is highly likely to be also located on the upper end of the distribution of the data "1" or "0". Therefore, when the data in the memory cell MCk is "0", the voltage V2nd is located on the upper end of the distribution of the data "0" as illustrated in FIG. 12B. The sense amplifier 120 apparently offsets the voltage V1st corresponding to the data in the memory cell MCk−1 to the voltage V1st+Vofs1 on the basis of the hold signal DO_PREV. Since the data in the memory cells MCk−1 and MCk are both located on the upper end of the distribution of the data "0", the data (the voltage V2nd) in the memory cell MCk can be detected using the voltage V1st+Vofs1 obtained by offsetting the voltage V1st corresponding to the data in the memory cell MCk−1 as the reference voltage.

Figure 12C:
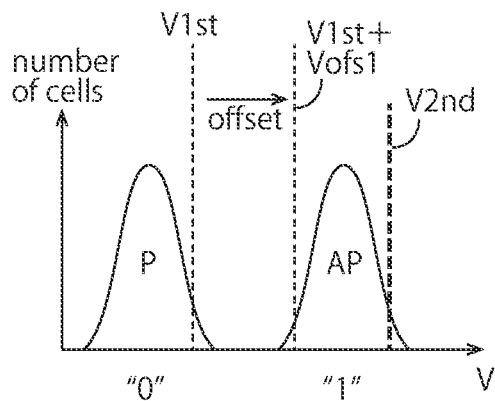

When the data in the memory cell MCk is "1", the voltage V2nd is located on the upper end of the distribution of the data "1" as illustrated in FIG. 12C. The sense amplifier 120 apparently offsets the voltage V1st corresponding to the data in the memory cell MCk−1 to the voltage V1st+Vofs1 on the basis of the hold signal DO_PREV. Since the data in the memory cells MCk−1 and MCk are located on the upper ends of the distributions of the data "0" and "1", respectively, the data (the voltage V2nd) in the memory cell MCk can be detected using the voltage V1st+Vofs1 obtained by offsetting the voltage V1st corresponding to the data in the memory cell MCk−1 as the reference voltage.

While the data in the memory cells MCk−1 and MCk are located on the upper ends of associated distributions in the specific examples illustrated in FIGS. 12 to 12C, respectively, the same holds for a case in which data in the memory cell MCk−1 and MCk are respectively located on the lower ends of the associated distributions.

In this manner, it is preferable that the memory cell MCk and the memory cell MCk−1 that are successively read be arranged near or adjacent to each other and have electrical properties similar to each other. It is also preferable that the wiring resistances from the driver 14, the sense circuit 100, or the like to the memory cell MCk and the memory cell MCk−1 be substantially equal to each other. This enables the sense amplifier 120 to correctly detect the data in the memory cell MCk using the data in the memory cell MCk−1 as reference data.

Figure 10A:
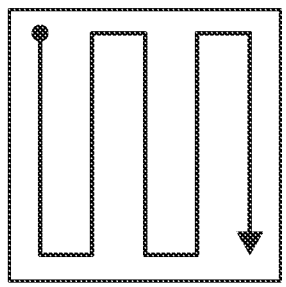
FIGS. 10A to 10D are conceptual diagrams illustrating reading orders of memory cells.
Figure 10B:
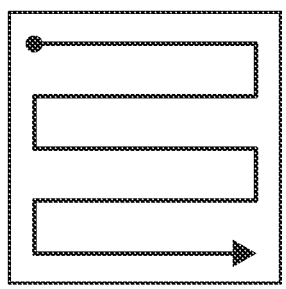

The order of reading the memory cells MC can be any of those illustrated in FIGS. 10A to 10D. In FIG. 10A or 10B, memory cells MC arrayed along word lines WL or bit lines BL are accessed in turns to read data therein. At this time, the sense circuit 100 reads data in a plurality of consecutive adjacent memory cells MC from one end of a certain word line WL or bit line BL to the other end thereof. Subsequently, the sense circuit 100 reads data in a plurality of consecutive adjacent memory cells MC from the other end of adjacent another word line WL or bit line BL to the one end thereof. The sense circuit 100 repeats this operation and reads data in memory cells MC consecutive in a zigzag manner. Accordingly, even when the electrical properties of distant memory cells MC in the memory cell array 11 are different from each other, the sense circuit 100 can detect data in a memory cell MCk using data in a memory cell MCk−1 as reference data as long as the electrical properties of neighboring memory cells MC are similar.

Figure 10C:
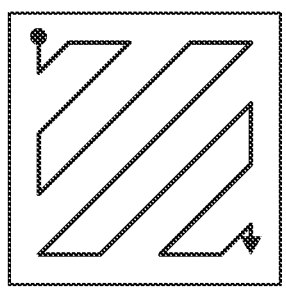

In FIG. 10C, the sense circuit 100 successively accesses memory cells MC adjacent in a diagonal direction of the memory cell array 11 (an oblique direction with respect to the word lines and the bit lines). In this case, adjacent two memory cells MC are connected to different word lines WL and bit lines BL, respectively.

Figure 10D:
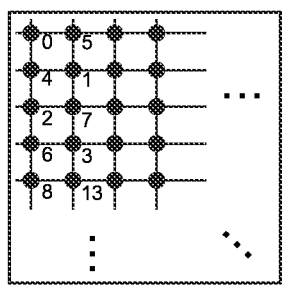

In FIG. 10D, the sense circuit 100 accesses adjacent or near memory cells in the order of memory cells MC0 to MC13. After accessing the memory cell MC13, the sense circuit 100 accesses a group of 13 memory cells adjacent in the direction of the word lines WL or the bit lines BL in the same order. While preferably adjacent to the memory cell MCk−1 in this way, the memory cell MCk does not always need to be adjacent thereto and may be arranged in the vicinity of the memory cell MCk−1. The vicinity can be a range where the memory cells MCk and MCk−1 have electrical properties and wiring resistances similar to each other.

According to the embodiment described above, the sense circuit 100 does not need to perform a plurality of read operations and write operations to one memory cell MC to read data in the memory cell MC as in the self-reference method. Therefore, the data read speed is higher than that in the self-reference method and the power consumption is lower. Further, the data write endurance is less deteriorated than in the self-reference method. Since the sense circuit 100 according to the present embodiment uses data in an adjacent memory cell MC as reference data, the reference signal is adjusted of itself. That is, a circuit that adjusts the reference signal according to the location of the memory cell MC is not required and the reference signal is naturally adjusted. Therefore, the circuit scale of the sense circuit 100 can be reduced and data in the memory cells MC can be correctly detected.

Furthermore, the sense circuit 100 according to the present embodiment is similar to a sense circuit used in the self-reference method. Therefore, the sense circuit 100 according to the present embodiment can be relatively easily created using an existing sense circuit of the self-reference method.

Second Embodiment

When it is detected with an ECC (Error-Correcting Code) or the like that read data includes an error, the next data is detected while referring to erroneous data. In this case, there is a risk that correct data cannot be detected.

In the present embodiment, when an error is detected, data is detected using normal data more previously detected (data of a cell two or more cells before) as reference data. In this case, alternatively, the next data may be detected using the self-reference method.

Figure 13:
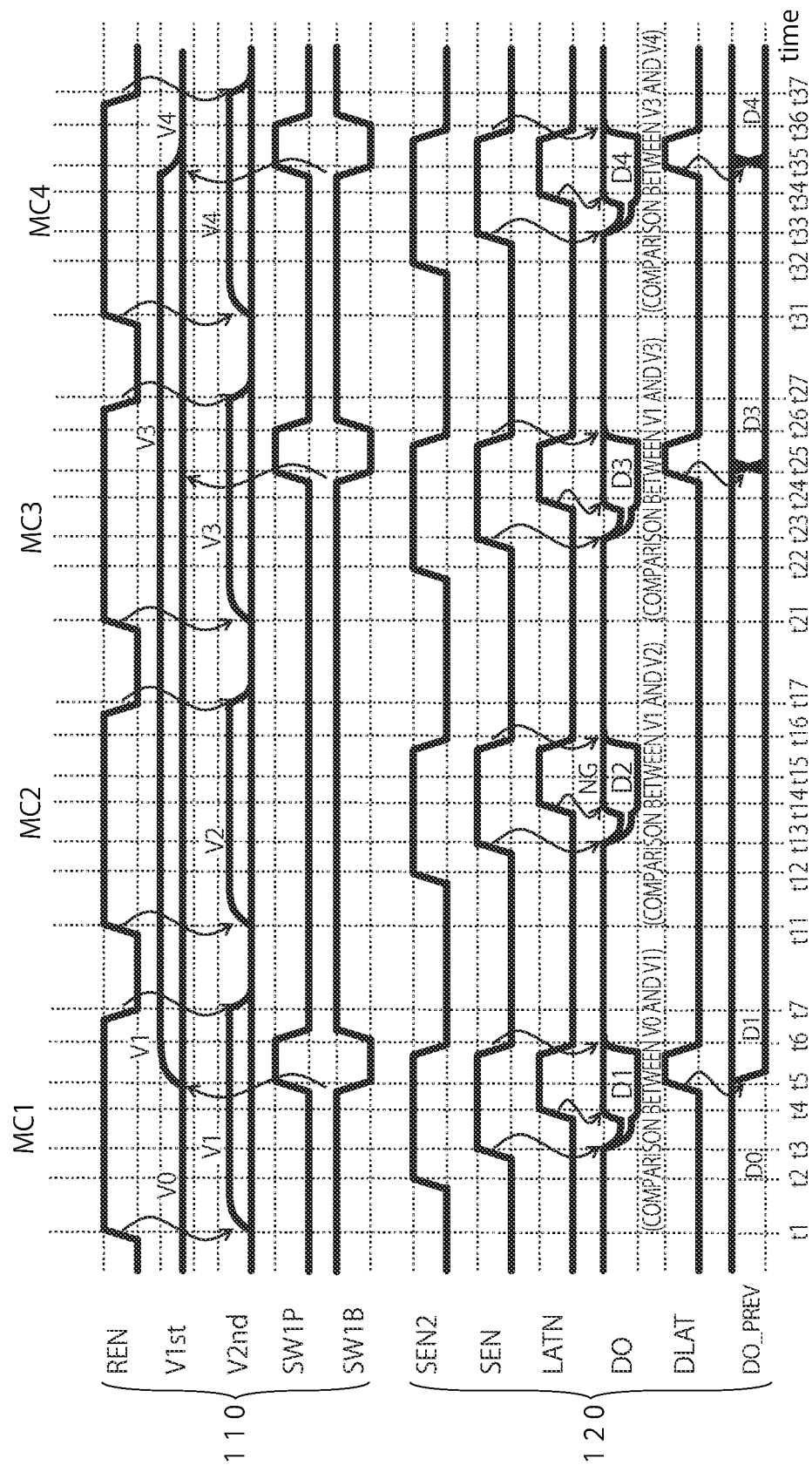
FIG. 13 is a timing chart illustrating an example of the read operation performed by the preamplifier and the sense amplifier according to a second embodiment.

FIG. 13 is a timing chart illustrating an example of the read operation performed by the preamplifier 110 and the sense amplifier 120 according to a second embodiment. It is assumed in this example that data read from the memory cell MC2 includes an error. In this case, data in the memory cell MC3 is detected using data in the memory cell MC1 as reference data. Read operations on the memory cells MC1 and MC4 can be identical to those in the first embodiment illustrated in FIG. 7. Therefore, explanations of operations from t1 to t7 and t31 to t37 are omitted.

When read data from the memory cell MC2 includes an error, the signals SW1P and SW1B are not activated and the switches M31 and M32 are kept OFF from t15 to t16. Accordingly, the data in in the memory cell MC2 is not transmitted to the node N17 and the voltage V1st keeps holding a voltage corresponding to the data in the memory cell MC1. The capacitor C3 is kept charged with the voltage corresponding to the data in the memory cell MC1. The signal DLAT is not raised and the register REG1 in FIG. 6 keeps a detection result on the data in the memory cell MC1 as the hold signal DO_PREV without updating the hold signal DO_PREV.

Therefore, at the time of read of the subsequent memory cell MC3, data in the memory cell MC3 is detected using the read data from the memory cell MC1 as the reference signal when the data in the memory cell MC3 does not includes an error. That is, when the read data includes an error, the preamplifier 110 does not hold the error data in the node N17 and the sense amplifier 120 does not latch the output signal DO based on the error data as the hold signal DO_PREV. The preamplifier 110 and the sense amplifier 120 hold previous normal read data in the node N17 and keep the data as the hold signal DO_PREV.

Accordingly, the data in the memory cell MC3 is detected while referring to read data of a cell two or more cells before (for example, the data in the memory cell MC1). This enables the sense amplifier 120 to correctly read the data in the memory cell MC3 even when the data in the memory cell MC2 includes an error.

Even when two consecutive memory cells MC include an error, the preamplifier 110 and the sense amplifier 120 keep holding previous normal data and therefore data in the next memory cell can be correctly read. In the present embodiment, a memory cell having reference data stored therein is sometimes not adjacent to a read target memory cell when an error occurs. However, since these memory cells are arranged in the vicinity to each other, no problem occurs.

Third Embodiment

Figure 14:
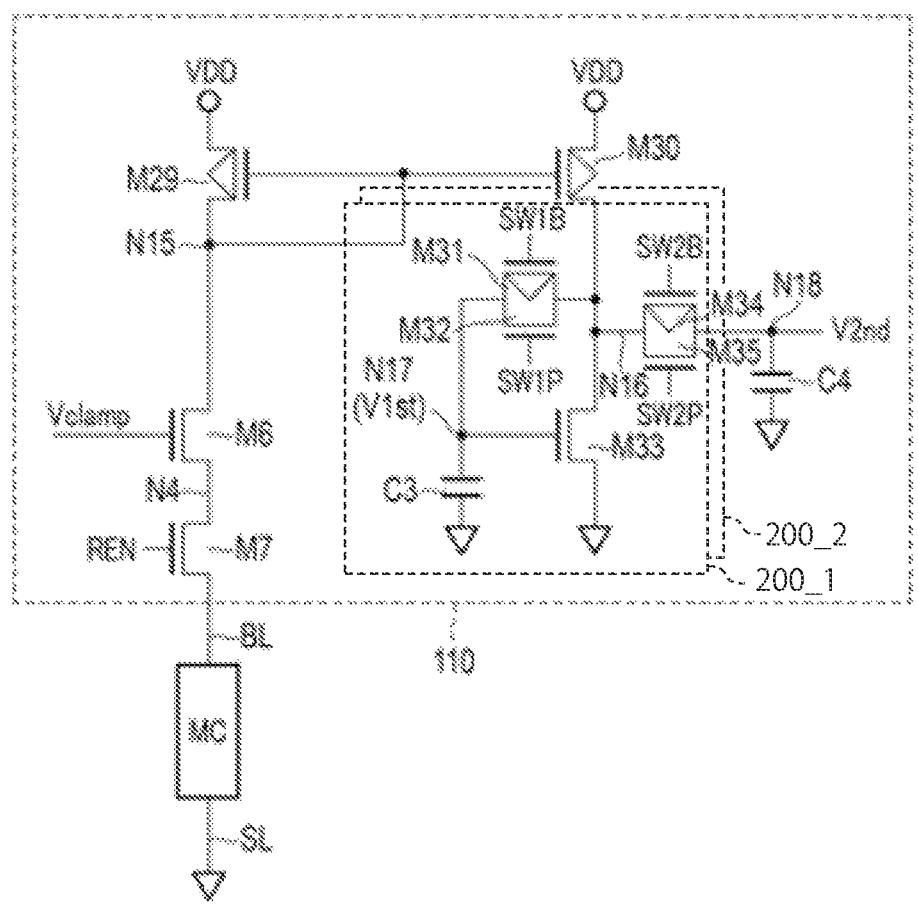
FIG. 14 is a circuit diagram illustrating a configuration example of the preamplifier according to a third embodiment.

FIG. 14 is a circuit diagram illustrating a configuration example of the preamplifier 110 according to a third embodiment.

In the third embodiment, the preamplifier 110 includes a plurality of blocks 200_1 and 200_2 each including the switches M31 and M32, the switches M34 and M35, the transistor M33, and the capacitor C3. The blocks 200_1 and 200_2 are connected in parallel to the nodes N16 and N18. The rest of the configuration of the preamplifier 110 can be identical to the corresponding configuration in the first embodiment and may be shared by the blocks 200_1 and 200_2. Therefore, the node N17 is provided for each of the blocks 200_1 and 200_2 and a plurality of voltages V1st can be held. Meanwhile, the node N18 is shared by the blocks 200_1 and 200_2 and one voltage V2nd is used in a read operation.

Figure 15:
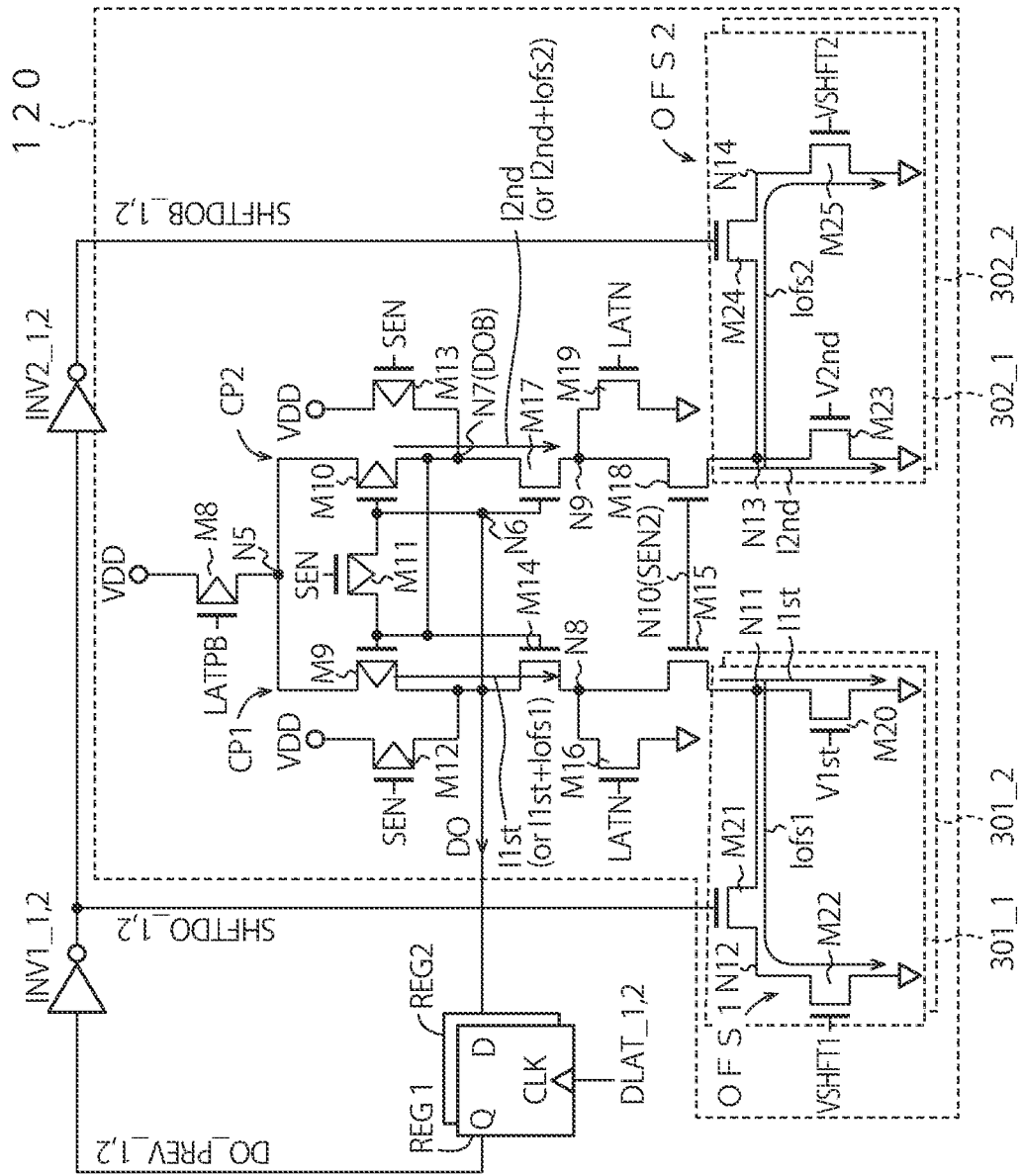
FIG. 15 is a circuit diagram illustrating a configuration example of the sense amplifier according to the third embodiment.

FIG. 15 is a circuit diagram illustrating a configuration example of the sense amplifier 120 according to the third embodiment. The sense amplifier 120 includes a plurality of blocks 301_1 and 301_2 each including the offset part OFS1 and the transistor M20, and a plurality of blocks 302_1 and 302_2 each including the offset part OFS2 and the transistor M25. The blocks 301_1 and 301_2 are respectively connected to outputs of inverters INV1_1 and INV1_2 and respectively receive signals SHFTDO_1 and SHFTDO_2. The blocks 301_1 and 301_2 are connected in common to the source of the transistor M15. The blocks 302_1 and 302_2 are respectively connected to outputs of the INV2_1 and INV2_2 and respectively receive signals SHFTDOB_1 and SHFTDOB_2. The blocks 302_1 and 302_2 are connected in common to the source of the transistor M18.

The sense amplifier 120 includes a plurality of registers REG1 and REG2, the inverters INV1_1 and INV1_2, and the inverters INV2_1 and INV2_2. The registers REG1 and REG2 receive the output signal DO, latch the output signal DO at a timing when latch signals DLAT_1 and DLAT_2 rise, and output the latched output signals DO as hold signals DO_PREV_1 and DO_PREV_2, respectively. The inverters INV1_1 and INV1_2 invert the hold signals DO_PREV_1 and DO_PREV_2 to output the signals SHFTDO_1 and SHFTDO_2, respectively. The inverters INV2_1 and INV2_2 invert the signals SHFTDO_1 and SHFTDO_2 to output the signals SHFTDOB_1 and SHIFTDOB_2, respectively.

The rest of the configuration of the sense amplifier 120 can be same as the corresponding configuration in the first embodiment and may be shared by the blocks 301_1 and 302_2, the registers REG1 and REG2, and the like.

As described above, the sense circuit 100 according to the third embodiment includes two systems of the registers REG1 and REG2, the nodes N17 and N18, and the like and can hold plural pieces of normal data that have been read in the past. Reference sign *_1 indicates a first system and reference sign *_2 indicates a second system. While the present embodiment has two systems, three or more systems may be included.

Figure 16:
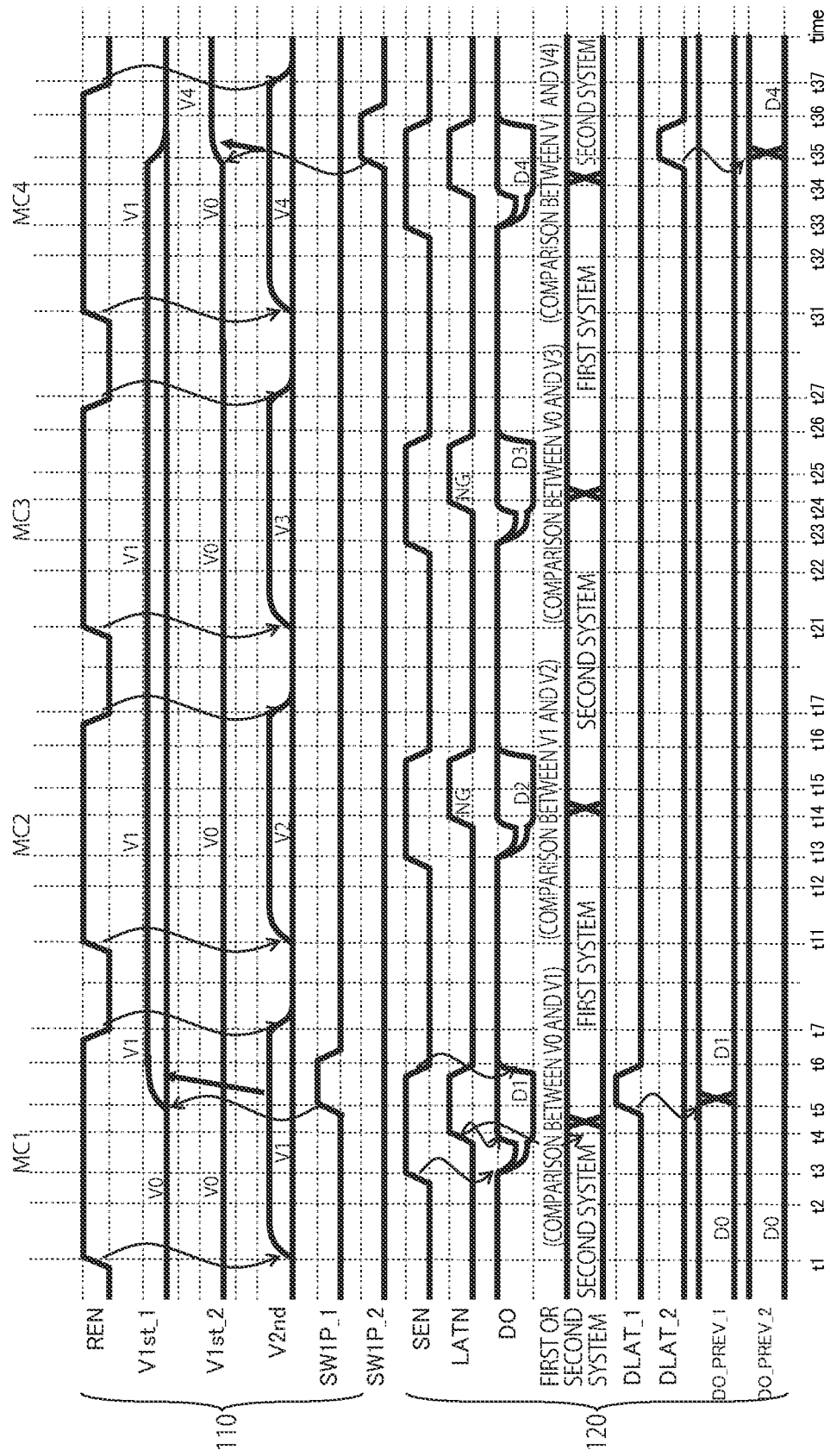
FIG. 16 is a timing chart illustrating an example of the read operation performed by the preamplifier and the sense amplifier according to the third embodiment.

FIG. 16 is a timing chart illustrating an example of the read operation performed by the preamplifier 110 and the sense amplifier 120 according to the third embodiment. It is assumed in this example that read data from the memory cells MC2 and MC3 include an error. In the following descriptions, differences between the third embodiment and the first embodiment are manly explained.

A voltage V0 corresponding to read data from the initial memory cell is held in the nodes N17 of both the blocks 200_1 and 200_2. Therefore, before t1, voltages V1st_1 and V1st_2 are both the voltage V0. Associated therewith, the registers REG1 and REG2 hold data D0 in the initial memory cell as the hold signals DO_PREV_1 and DO_PREV_2, respectively, in the initial state. The sense circuit 100 alternately uses the first system and the second system in read of data from the memory cells MC.

In a read operation on the memory cell MC1 from t1 to t7, the voltage V2nd of the node N18 becomes a voltage V1 corresponding to data in the memory cell MC1. Assuming that the second system is first used, the sense amplifier 120 detects the data in the memory cell MC1 using the voltage V1st_2 in the initial state as the reference signal. The detection method of the memory cell MC1 may be the same as that of the first embodiment.

When the data in the memory cell MC1 is normal, the voltage V1 corresponding to the data in the memory cell MC1 is held in the node N17 in the block 200_1 of the first system from t5 to t6. Therefore, the voltage V1st_1 becomes the voltage V1 in the read operation on the memory cell MC2. The voltage V1st_2 of the node N17 in the second system remains the voltage V0.

The latch signal DLAT_1 in the first system rises from t5 to t6. Accordingly, the register REG1 latches data D1 output as the output signal DO and outputs the latched data D1 as the hold signal DO_PREV_1. At this time, the register REG2 in the second system keeps latching the data DO as the hold signal DO_PREV_2.

In a read operation on the memory cell MC2 from t11 to t17, the voltage V2nd of the node N18 becomes a voltage V2 corresponding to data in the memory cell MC2. Since the first system is used this time, the sense amplifier 120 detects the data in the memory cell MC2 using the voltage V1st_1 as the reference signal. The detection method of the memory cell MC2 may be basically the same as that of the first embodiment.

When the data in the memory cell MC2 includes an error at this time, the signals SW1P_1 and SW1P_2 do not rise and the latch signals DLAT_1 and DLAT_2 do not rise, either. Therefore, while appearing as the voltage V2nd of the node N18, the voltage V2 corresponding to the data in the memory cell MC2 is not held in the nodes N17 of the blocks 200_1 and 200_2. Accordingly, the voltage V1st_1 of the node 17 in the block 200_1 remains the voltage V1 and the voltage V1st_2 of the node N17 in the block 200_2 remains the voltage V0. The registers REG1 and REG2 keep the data D1 and D0 without changing the hold signals DO_PREV_1 and DO_PREV2, respectively.

In a read operation on the memory cell MC3 from t21 to t27, the voltage V2nd of the node N18 becomes a voltage V3 corresponding to data in the memory cell MC3. Since the second system is used this time, the sense amplifier 120 detects the data in the memory cell MC3 using the voltage V1st_2 as the reference signal. The detection method of the memory cell MC3 may be basically the same as that of the first embodiment.

When the data in the memory cell MC3 also includes an error, the signals SW1P_1 and SW1P_2 do not rise and the latch signals DLAT_1 and DLAT_2 do not rise, either. Therefore, while appearing as the voltage V2nd of the node N18, the voltage V3 corresponding to the data in the memory cell MC3 is not held in the nodes N17 of the blocks 200_1 and 200_2. Accordingly, the voltage V1st_1 of the node N17 in the block 200_1 remains the voltage V1 and the voltage V1st_2 of the node N17 in the block 200_2 remains the voltage V0. The registers REG1 and REG2 respectively keep the data D1 and DO without changing the hold signals DO_PREV_1 and DO_PREV_2.

In a read operation on the memory cell MC4 from t31 to t37, the voltage V2nd of the node N18 becomes a voltage V4 corresponding to data in the memory cell MC4. Since the second system is used this time, the sense amplifier 120 detects the data in the memory cell MC4 using the voltage V1st_2 as the reference signal. The detection method of the memory cell MC4 may be basically the same as that of the first embodiment.

When the data in the memory cell MC4 is normal, the signal SW1P_2 and the latch signal DLAT_2 rise from t35 to t36. Therefore, the voltage V4 corresponding to the data in the memory cell MC4 is held as the voltage V1st_2 in the node N17 of the block 200_2. The voltage V1st_1 of the node N17 in the block 200_1 remains the voltage V1. The register REG2 latches data D4 output as the output signal DO from the sense amplifier 120 to be output as the hold signal DO_PREV_2. At this time, the register REG1 in the first system keeps latching the data D1 as the hold signal DO_PREV_1.

In this manner, the sense circuit 100 according to the present embodiment holds plural pieces of past normal data as the voltages V1st in the nodes N17 and does not hold error data when the error data is detected. The voltages V1st corresponding to the plural pieces of past normal data are used as reference voltages for data that will subsequently be detected. When error data is detected, the registers REG1 and REG2 do not latch (update) the output signal DO of the error data as the hold signals DO_PREV_1 and DO_PREV_2 and keep the hold signals DO_PREV_1 and DO_PREV_2 based on previous normal data, respectively. Accordingly, when read target data includes an error, the sense circuit 100 can detect subsequent data with referring to the past normal data.

In the present embodiment, the switching operation has been explained assuming three-terminal transistors are an example of the switching elements. However, the switching elements are not limited thereto, and two-terminal switching elements may be used as the switching elements. In this case, these switching elements are in a "high resistance" state, for example, an electrically non-conductive state when a voltage applied to between the two terminals is lower than a threshold. The switching elements are brought to a "low resistance" state, for example, an electrically conductive state when the voltage applied to the two terminals is equal to or higher than the threshold.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:
1. A semiconductor storage device comprising:
a plurality of memory cells;
a first node holding first data read from a first memory cell among the memory cells;
a second node holding second data read from a second memory cell near the first memory cell among the memory cells;
a differential circuit comprising a first current path passing a first current corresponding to a voltage of the first node and a second current path passing a second current corresponding to a voltage of the second node, and configured to output an output signal corresponding to a voltage difference between the first node and the second node from an output part;
a first register configured to latch the output signal and output the signal as a hold signal;
a first offset part connected to the first current path and configured to offset the first current when the hold signal has a first logic level; and
a second offset part connected to the second current path and configured to offset the second current when the hold signal has a second logic level that is opposite to the first logic level.

2. The device of claim 1, wherein
the differential circuit comprises:
a first transistor provided on the first current path and having a gate connected to the second current path, and
a second transistor provided on the second current path and having a gate connected to the first current path and the output part.

3. The device of claim 2, wherein:
the first offset part passes a first offset current to shift a gate voltage of the second transistor when the hold signal has the first logic level, and
the second offset part passes a second offset current to shift a gate voltage of the first transistor when the hold signal has the second logic level.

4. The device of claim 3, wherein:
the first offset part comprises a first offset transistor configured to pass the first offset current when a first shift voltage is applied to a gate, and
the second offset part comprises a second offset transistor configured to pass the second offset current when a second shift voltage is applied to a gate.

5. The device of claim 3, wherein:
the first offset current is a current value between a current value flowing in the first current path when the first or second data has the first logic level, and a current value flowing in the first current path when the first or second data has the second logic level, and
the second offset current is a current value between a current value flowing in the second current path when the first or second data has the first logic level, and a current value flowing in the second current path when the first or second data has the second logic level.

6. The device of claim 1, wherein the first data is data having been read before the second data is read.

7. The device of claim 1, wherein known initial data is stored in a memory cell being a first read target among the memory cells.

8. The device of claim 1, wherein:
the first register latches the output signal, and the first node holds the second data, and
the second node holds third data read from a third memory cell near the second memory cell among the memory cells.

9. The device of claim 1, further comprising:
a first capacitor connected to the first node and configured to hold the first data, and
a second capacitor connected to the second node and configured to hold the second data.

10. The device of claim 1, wherein the first memory cell and the second memory cell are adjacent to each other.

11. The device of claim 1, wherein the memory cells are provided to correspond to intersections between first lines and second lines intersecting with each other, respectively.

12. The device of claim 1, wherein the memory cells are magnetoresistance change memory cells or resistance change memory cells.

13. A control method of a semiconductor device comprising a plurality of memory cells, a differential circuit configured to output a voltage difference between a first node and a second node as an output signal, a first register configured to latch the output signal and output the signal as a hold signal, a first offset part configured to pass a first offset current to a first current path of the differential circuit, and a second offset part configured to pass a second offset current to a second current path of the differential circuit, the method comprising:
holding first data read from a first memory among the memory cells in the first node;
outputting the hold signal based on the first data from the first register;
holding second data read from a second memory cell near the first memory cell among the memory cells in the second node;
passing the first offset current to the first current path when the hold signal has a first logic level, and passing the second offset current to the second current path when the hold signal has a second logic level that is opposite to the first logic level; and
outputting a voltage difference between the first node and the second node as the output signal.

14. The method of claim 13, wherein:
the differential circuit comprises a first transistor provided on the first current path and having a gate connected to the second current path, and a second transistor provided on the second current path and having a gate connected to the first current path and an output part of the differential circuit,
the first offset part passes a first offset current to shift a gate voltage of the second transistor when the hold signal has the first logic level, and
the second offset part passes a second offset current to shift a gate voltage of the first transistor when the hold signal has the second logic level.

15. The method of claim 14, wherein:
the first offset part comprises a first offset transistor configured to pass the first offset current when a first shift voltage is applied to a gate,
the second offset part comprises a second offset transistor configured to pass the second offset current when a second shift voltage is applied to a gate, and
the first shift voltage is a substantially intermediate voltage between a voltage of the first or second node when the first or second data has the first logic level and a voltage of the first or second node when the first or second data has the second logic level.

16. The method of claim 13, wherein known initial data is stored in a memory cell being a first read target among the memory cells.

17. The method of claim 13, further comprising:
latching the output signal as the hold signal in the first register when a voltage difference between the first node and the second node is output as the output signal,
holding third data read from a third memory cell near the second memory cell among the memory cells in the second node,
passing the first offset current to the first current path when the hold signal has the first logic level and passing the second offset current to the second current path when the hold signal has the second logic level, and
outputting the voltage difference between the first node and the second node as the output signal.

18. The method of claim 17, wherein the second memory cell and the third memory cell are adjacent to each other.

19. The method of claim 17, wherein the first register does not latch the output signal based on the voltage difference between the first node and the second node as the hold signal and keeps a previous hold signal when the second data includes an error.

20. The method of claim 13, wherein the first memory cell and the second memory cell are adjacent to each other.

* * * * *